US012772488B2

(12) United States Patent
Lu et al.

(10) Patent No.: US 12,772,488 B2
(45) Date of Patent: Oct. 20, 2026

(54) SEMICONDUCTOR DEVICE AND METHODS OF FORMATION

(71) Applicant: Taiwan Semiconductor Manufacturing Company, Ltd., Hsinchu (TW)

(72) Inventors: Min-Hsuan Lu, Hsinchu City (TW); Sheng-Tsung Wang, Hsinchu (TW); Huan-Chieh Su, Tianzhong Township, Changhua County (TW); Tzu Pei Chen, Taipei City (TW); Hao-Heng Liu, Hsinchu City (TW); Chien-Hung Lin, Taoyuan County (TW); Chih-Hao Wang, Baoshan Township, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 472 days.

(21) Appl. No.: 18/356,912

(22) Filed: Jul. 21, 2023

(65) Prior Publication Data

US 2025/0031404 A1 Jan. 23, 2025

(51) Int. Cl.

| | |
|---|---|
| ***H10D 30/62*** | (2025.01) |
| ***H10D 30/01*** | (2025.01) |
| ***H10D 64/01*** | (2025.01) |
| ***H10D 84/01*** | (2026.01) |
| ***H10D 84/03*** | (2025.01) |
| ***H10D 84/85*** | (2025.01) |

(52) U.S. Cl.

CPC ....... *H10D 30/6219* (2025.01); *H10D 30/024* (2025.01); *H10D 30/6211* (2025.01); *H10D 64/017* (2025.01); *H10D 84/017* (2025.01); *H10D 84/0193* (2025.01); *H10D 84/038* (2025.01); *H10D 84/853* (2025.01)

(58) Field of Classification Search

CPC ........... H10D 30/6219; H10D 30/6211; H10D 64/017; H10D 84/853; H10D 30/024; H10D 84/017

See application file for complete search history.

(56) References Cited

U.S. PATENT DOCUMENTS

2020/0135559 A1* 4/2020 Kelly .................. H01L 21/7684
2021/0407808 A1* 12/2021 Chou ................ H01L 21/32134
2022/0005813 A1* 1/2022 Kwon .................... H10B 12/30

(Continued)

*Primary Examiner* — Christine A Enad
(74) *Attorney, Agent, or Firm* — Harrity & Harrity, LLP

(57) ABSTRACT

A semiconductor device may include one or more transistor structures that include a plurality of source/drain regions and a gate structure between the source/drain regions. The semiconductor device may further include one or more dielectric layers between a source/drain contact structure and a gate structure of the one or more of the transistor structures. The one or more dielectric layers may be manufactured using on oxidation treatment process to tune the dielectric constant of the one or more dielectric layers. The dielectric constant of the one or more dielectric layers may be tuned to reduce the parasitic capacitance between the source/drain contact structure and the gate structure (which are conductive structures). In particular, the dielectric constant of the one or more spacer dielectric may be tuned using the oxidation treatment process to lower the as-deposited dielectric constant of the one or more dielectric layers.

20 Claims, 27 Drawing Sheets

(56) References Cited

U.S. PATENT DOCUMENTS

| | | | | |
|---|---|---|---|---|
| 2022/0246738 | A1* | 8/2022 | Kim | H01L 21/76831 |
| 2022/0367677 | A1* | 11/2022 | Chen | H01L 21/76828 |
| 2023/0395667 | A1* | 12/2023 | Han | H10D 30/6219 |

* cited by examiner

SEMICONDUCTOR DEVICE AND METHODS OF FORMATION

BACKGROUND

Fin-based transistors, such as fin field effect transistors (finFETs) and nanostructure transistors (e.g., nanowire transistors, nanosheet transistors, gate-all-around (GAA) transistors, multi-bridge channel transistors, nanoribbon transistors), are three-dimensional structures that include a channel region in a fin (or a portion thereof) that extends above a semiconductor substrate as a three-dimensional structure. A gate structure, configured to control a flow of charge carriers within the channel region, wraps around the fin of semiconductor material. As an example, in a finFET, the gate structure wraps around three sides of the fin (and thus the channel region), thereby enabling increased control over the channel region (and therefore switching of the finFET). As another example, in a nanostructure transistor, the gate structure wraps around a plurality of channel regions in a fin structure such that the gate structure surrounds each of the plurality of channel regions. Source/drain regions (e.g., epitaxial regions) are located on opposing sides of the gate structure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
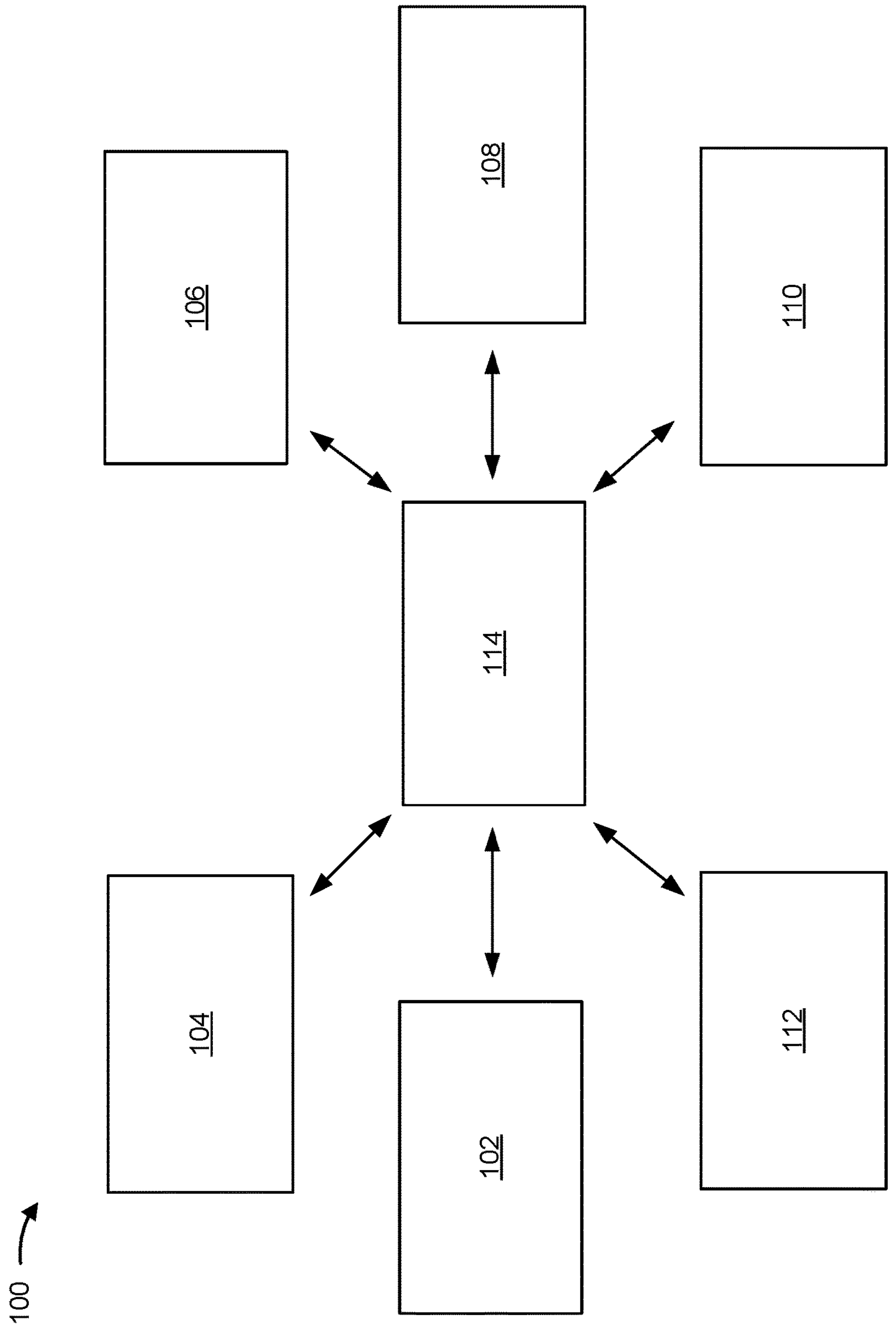
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Transistor structures (e.g., planar transistors, fin field effect transistors (finFETs), nanostructure transistors) in a semiconductor device may include various liner layers, barrier layers, and/or spacer layers. These layers may be included to provide electrical isolation between conductive structures of the transistor structures, to promote adhesion between the conductive structures and surrounding dielectric regions, and/or to prevent material migration into the dielectric regions, among other examples.

The semiconductor industry is constantly working toward shrinking processing node sizes in an effort to increase transistor density and/or to reduce power consumption in manufactured semiconductor devices. While the increased transistor density and/or the reduced power consumption may increase the efficiency and/or processing power of the semiconductor devices, reducing the size of structures and/or layers in the semiconductor devices may cause undesirable side effects that may compromise the performance of the semiconductor devices. For example, reducing the size of structures and/or layers in a semiconductor device may result in reduced dielectric material between conductive structures in the semiconductor device. This may result in the conductive structures being positioned closer together, which can result in current leakage between the conductive structures and/or parasitic capacitance between the conductive structures, among other examples.

Moreover, the parasitic capacitance in the semiconductor device may result in reduced performance in the semiconductor device in that the parasitic capacitance may result in residual charge stored in a source/drain contact and/or a gate structure of a transistor of the semiconductor device, which may result in longer switching times for the transistor (e.g., between an on state and an off state) due to an increased resistance-capacitance (RC) time constant that results from the parasitic capacitance. Moreover, the parasitic capacitance may result in electrical coupling between conductive structures of the transistors, which may increase processing errors in the semiconductor device and/or reduced processing speeds due to increased noise from the parasitic capacitance.

In some implementations described herein, a semiconductor device may include a plurality of transistor structures. Each transistor structure may include a plurality of source/drain regions, a semiconductor channel region between the source/drain regions, and a gate structure that is configured to selectively control the conductivity of the semiconductor channel region between the source/drain regions, thereby enabling the transistor structure to be switched between an on state and an off state. A source/drain region may refer to a source or a drain, individually or collectively dependent upon the context.

The semiconductor device may further include one or more dielectric layers between a source/drain contact structure (e.g., an MD) and a gate structure (e.g., an MG) of one or more of the transistor structures. The one or more dielectric layers may be manufactured using an oxidation treatment process to tune the dielectric constant of the one or more dielectric layers. The dielectric constant of the one or more dielectric layers may be tuned to reduce the parasitic capacitance between the source/drain contact structure and the gate structure (which are conductive structures). In particular, the dielectric constant of the one or more spacer dielectric may be tuned using the oxidation treatment process to lower the as-deposited dielectric constant of the one or more dielectric layers.

In this way, the oxidation treatment process may be used to lower the dielectric constant of the one or more dielectric layers after the one or more dielectric layers are deposited. This enables the dielectric constant to initially remain high after deposition of the one or more dielectric layers, which enables the one or more dielectric layers to better withstand damage from one or more subsequent semiconductor processing operations (e.g., etching operations, pre-cleaning operations) after deposition of the one or more dielectric layers.

Moreover, this enables the dielectric constant of the one or more dielectric layers to be subsequently reduced, which may reduce the parasitic capacitance between the source/drain contact structure and the gate structure when the transistor structure is operating because the parasitic capacitance between the source/drain contact structure and the gate structure may be directly proportional to the dielectric constant of the one or more dielectric layers between the source/drain contact structure and the gate structure. The reduced parasitic capacitance may enable shorter switching times for the transistor structure, which may increase the performance of the semiconductor device and/or may reduce processing errors in the semiconductor device.

FIG. 1 is a diagram of an example environment 100 in which systems and/or methods described herein may be implemented. As shown in FIG. 1, the example environment 100 may include a plurality of semiconductor processing tools 102-112 and a wafer/die transport tool 114. The plurality of semiconductor processing tools 102-112 may include a deposition tool 102, an exposure tool 104, a developer tool 106, an etch tool 108, a planarization tool 110, a plating tool 112, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, a low-pressure CVD (LPCVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the deposition tool 102 includes an epitaxial tool that is configured to form layers and/or regions of a device by epitaxial growth. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

Wafer/die transport tool 114 includes a mobile robot, a robot arm, a tram or rail car, an overhead hoist transport (OHT) system, an automated materially handling system (AMHS), and/or another type of device that is configured to transport substrates and/or semiconductor devices between semiconductor processing tools 102-112, that is configured to transport substrates and/or semiconductor devices between processing chambers of the same semiconductor processing tool, and/or that is configured to transport substrates and/or semiconductor devices to and from other locations such as a wafer rack, a storage room, and/or the like. In some implementations, wafer/die transport tool 114 may be a programmed device that is configured to travel a particular path and/or may operate semi-autonomously or autonomously. In some implementations, the example environment 100 includes a plurality of wafer/die transport tools 114.

For example, the wafer/die transport tool 114 may be included in a cluster tool or another type of tool that includes a plurality of processing chambers, and may be configured to transport substrates and/or semiconductor devices between the plurality of processing chambers, to transport substrates and/or semiconductor devices between a processing chamber and a buffer area, to transport substrates and/or semiconductor devices between a processing chamber and an interface tool such as an equipment front end module (EFEM), and/or to transport substrates and/or semiconductor devices between a processing chamber and a transport carrier (e.g., a front opening unified pod (FOUP)), among other examples. In some implementations, a wafer/die transport tool 114 may be included in a multi-chamber (or cluster) deposition tool 102, which may include a pre-clean processing chamber (e.g., for cleaning or removing oxides, oxidation, and/or other types of contamination or byproducts from a substrate and/or semiconductor device) and a plurality of types of deposition processing chambers (e.g., processing chambers for depositing different types of materials, processing chambers for performing different types of deposition operations). In these implementations, the wafer/die transport tool 114 is configured to transport substrates and/or semiconductor devices between the processing chambers of the deposition tool 102 without breaking or removing a vacuum (or an at least partial vacuum) between the processing chambers and/or between processing operations in the deposition tool 102, as described herein.

In some implementations, one or more of the semiconductor processing tools 102-112 and/or the wafer/die transport tool 114 may perform one or more semiconductor processing operations described herein. For example, one or more of the semiconductor processing tools 102-112 and/or the wafer/die transport tool 114 may form a fin structure above a substrate; may form a gate structure that wraps around the fin structure on at least three sides of the fin structure; may form a first source/drain region and a second source/drain region on the fin structure, where the gate structure is between the first source/drain region and the second source/drain region; may form a recess above the first source/drain region, where the recess is adjacent to the gate structure; may form a liner on sidewalls of the recess; may perform an oxidation treatment operation to oxidize the liner; and/or may form a source/drain contact over the liner in the recess such that the source/drain contact is coupled with the first source/drain region, among other examples.

As another example, one or more of the semiconductor processing tools 102-112 and/or the wafer/die transport tool 114 may form a fin structure above a substrate; may form a gate structure that wraps around the fin structure on at least three sides of the fin structure; may form a first source/drain region and a second source/drain region on the fin structure, where the gate structure is between the first source/drain region and the second source/drain region; may form a recess above the first source/drain region, where the recess is adjacent to the gate structure; may form a first liner on sidewalls of the recess; may perform an oxidation treatment operation to oxidize the first liner; may form a second liner on the first liner after performing the oxidation treatment operation; and/or may form a source/drain contact over the second liner in the recess such that the source/drain contact is coupled with the first source/drain region, among other examples.

One or more of the semiconductor processing tools 102-112 and/or the wafer/die transport tool 114 may perform other semiconductor processing operations described herein, such as in connection with FIGS. 3A-3D, 4A-4C, 5A-5D, 6A-6I, 11, and/or 12, among other examples.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of the example environment 100 may perform one or more functions described as being performed by another set of devices of the example environment 100.

Figure 2:
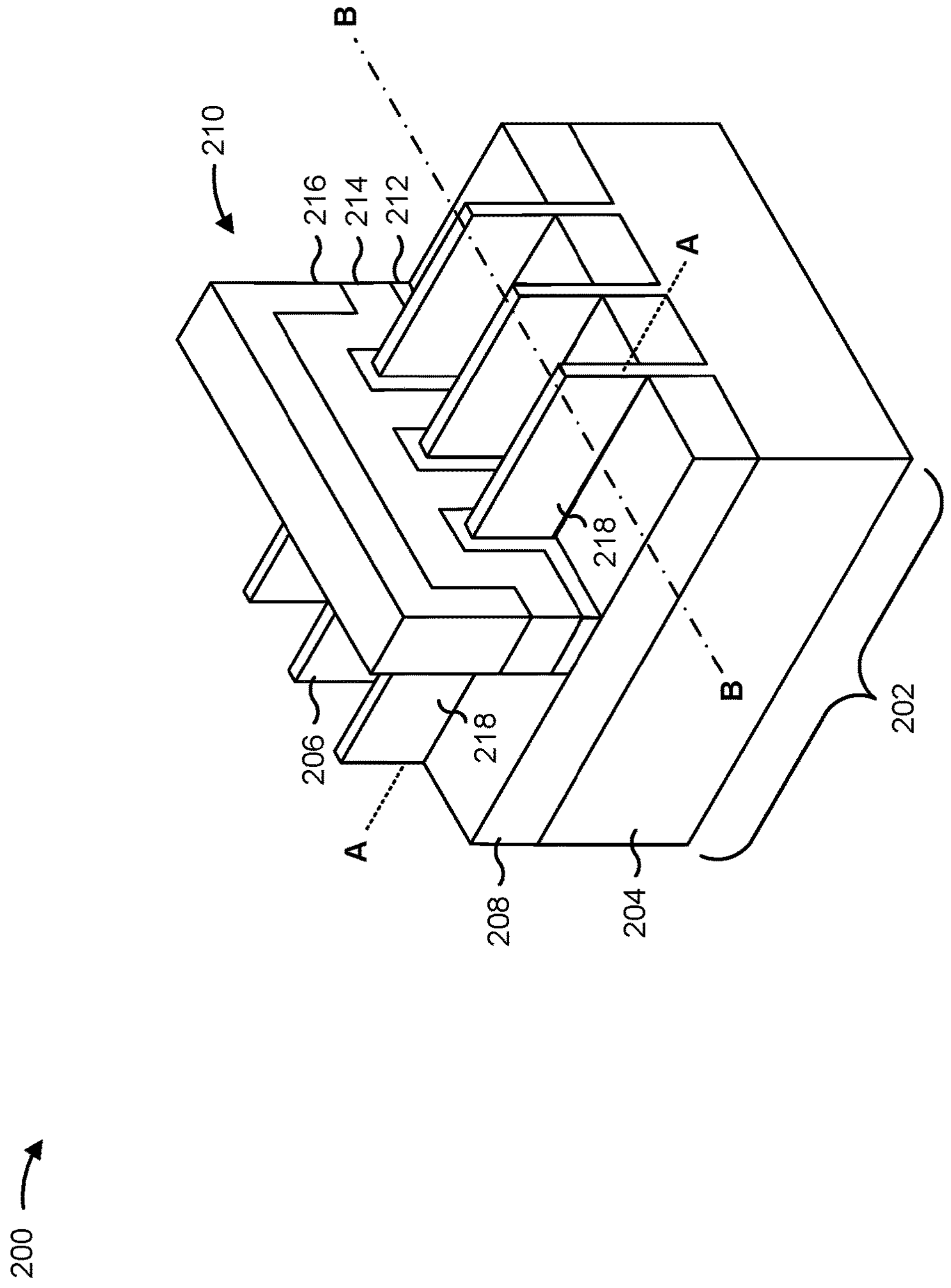
FIG. 2 is a diagram of example regions of a semiconductor device described herein.

FIG. 2 is a diagram of example regions of a semiconductor device 200 described herein. In particular, FIG. 2 illustrates an example device region 202 of the semiconductor device 200 in which one or more transistors or other devices are included. The transistors may include fin-based transistors, such as fin field effect transistors (finFETs), nanostructure transistors, and/or other types of transistors. In some implementations, the device region 202 includes a p-type metal oxide semiconductor (PMOS) region, an n-type metal oxide semiconductor (NMOS) region, a complementary metal oxide semiconductor (CMOS) region, and/or another type of device region. FIGS. 3A-6I are schematic cross-sectional views of various portions of the device region 202 of the semiconductor device 200 illustrated in FIG. 2, and correspond to various processing stages of forming fin-based transistors in the device region 202 of the semiconductor device 200.

The semiconductor device 200 includes a substrate 204. The substrate 204 includes a silicon (Si) substrate, a substrate formed of a material including silicon, a III-V compound semiconductor material substrate such as gallium arsenide (GaAs), a silicon on insulator (SOI) substrate, a germanium substrate (Ge), a silicon germanium (SiGe) substrate, or another type of semiconductor substrate. The substrate 204 may include a round/circular substrate having an approximately 200 mm diameter, an approximately 300 mm diameter, or another diameter, such as 450 mm, among other examples. The substrate 204 may alternatively be any polygonal, square, rectangular, curved, or otherwise non-circular workpiece, such as a polygonal substrate.

Fin structures 206 are included above (and/or extend above) the substrate 204 for the device region 202. A fin structure 206 may provide an active region where one or more devices (e.g., fin-based transistors) are formed. In some implementations, the fin structures 206 include silicon (Si) materials or another elementary semiconductor material such as germanium (Ge). In some implementations, the fin structures 206 include an alloy semiconductor material such as silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), gallium indium arsenide phosphide (GaInAsP), or a combination thereof. In some implementations, the fin structures 206 are doped using n-type and/or p-type dopants.

The fin structures 206 are fabricated by suitable semiconductor process techniques, such as masking, photolithography, and/or etch processes, among other examples. As an example, the fin structures 206 may be formed by etching a portion of the substrate 204 away to form recesses in the substrate 204. The recesses may then be filled with isolating material that is recessed or etched back to form shallow trench isolation (STI) regions 208 above the substrate 204 and between the fin structures 206. Other fabrication techniques for the STI regions 208 and/or for the fin structures 206 may be used. The STI regions 208 may electrically isolate adjacent active areas in the fin structures 206. The STI regions 208 may include a dielectric material such as a silicon oxide (SiOx), a silicon nitride (SixNy), a silicon oxynitride (SiON), fluoride-doped silicate glass (FSG), a low-k dielectric material, and/or other suitable insulating material. The STI regions 208 may include a multi-layer structure, for example, having one or more liner layers.

A dummy gate structure 210 (or a plurality of dummy gate structures 210) is included in the device region 202 over the fin structures 206 (e.g., approximately perpendicular to the fin structures 206). The dummy gate structure 210 engages the fin structures 206 on three or more sides of the fin structures 206. In the example depicted in FIG. 2, the dummy gate structure 210 includes a gate dielectric layer 212, a gate electrode layer 214, and a hard mask layer 216. In some implementations, the dummy gate structure 210 further includes a capping layer, one or more spacer layers, and/or another suitable layer. The various layers of the dummy gate structure 210 may be formed by suitable deposition techniques and patterned by suitable photolithography and etching techniques.

The term, "dummy", as described here, refers to a sacrificial structure which will be removed in a later stage and will be replaced with another structure, such as a high dielectric constant (high-k) dielectric and metal gate structure in a replacement gate process. The replacement gate process refers to manufacturing a gate structure at a later stage of the overall gate manufacturing process. Accordingly, the configuration of the semiconductor device 200 illustrated in FIG. 2 may include an intermediate configuration, and additional semiconductor processing operations may be performed for the semiconductor device 200 to further process the semiconductor device 200.

The gate dielectric layer 212 may include a dielectric oxide layer. The dielectric oxide layer may be formed by chemical oxidation, thermal oxidation, ALD, CVD, and/or other suitable methods. The gate electrode layer 214 may include a poly-silicon material or another suitable material. The gate electrode layer 214 may be formed by suitable deposition processes such as LPCVD or PECVD, among other examples. The hard mask layer 216 may include any material suitable to pattern the gate electrode layer 214 with particular features/dimensions on the substrate 204.

In some implementations, the various layers of the dummy gate structure 210 are first deposited as blanket layers. Then, the blanket layers are patterned through a process including photolithography and etching processes, removing portions of the blanket layers and keeping the remaining portions over the STI regions 208 and the fin structures 206 to form the dummy gate structure 210.

Source/drain areas 218 are disposed in opposing regions of the fin structures 206 with respect to the dummy gate structure 210. The source/drain areas 218 include areas in the device region 202 in which source/drain regions are to be formed. The source/drain regions in the device region 202 include silicon (Si) with one or more dopants, such as a p-type material (e.g., boron (B) or germanium (Ge), among other examples), an n-type material (e.g., phosphorous (P) or arsenic (As), among other examples), and/or another type of dopant. Accordingly, the device region 202 may include PMOS transistors that include p-type source/drain regions, NMOS transistors that include n-type source/drain regions, and/or other types of transistors.

Some source/drain regions may be shared between various transistors in the device region 202. In some implementations, various ones of the source/drain regions may be connected or coupled together such that fin-based transistors in the device region 202 are implemented as two functional transistors. For example, if neighboring (e.g., as opposed to opposing) source/drain regions are electrically connected, such as through coalescing the regions by epitaxial growth (e.g., neighboring source/drain regions, as opposed to on opposing sides of the dummy gate structure 210, being coalesced), two functional transistors may be implemented. Other configurations in other examples may implement other numbers of functional transistors.

FIG. 2 further illustrates reference cross-sections that are used in later figures, including FIGS. 3A-8. Cross-section A-A is in a plane along a channel in a fin structure 206 between opposing source/drain areas 218. Cross-section B-B is in a plane perpendicular to cross-section A-A, and is across a source/drain area 218 in fin structure 206. Subsequent figures refer to these reference cross-sections for clarity. In some figures, some reference numbers of components or features illustrated therein may be omitted to avoid obscuring other components or features for ease of depicting the figures.

As indicated above, FIG. 2 is provided as an example. Other examples may differ from what is described with regard to FIG. 2.

FIGS. 3A-3D are diagrams of an example implementation 300 described herein. The example implementation 300 includes an example of forming fin structures 206 for transistors of the semiconductor device 200. FIGS. 3A-3D are illustrated from the perspective of the cross-sectional plane B-B in FIG. 2 for the semiconductor device 200.

In some implementations, one or more of the semiconductor processing operations described in connection with FIGS. 3A-3D are performed by one or more of the semiconductor processing tools 102-112 and/or the wafer/die transport tool 114 described in connection with FIG. 1. In some implementations, one or more of the semiconductor processing operations described in connection with FIGS. 3A-3D are performed by one or more of the semiconductor processing tools not shown in FIG. 1.

Figure 3A:
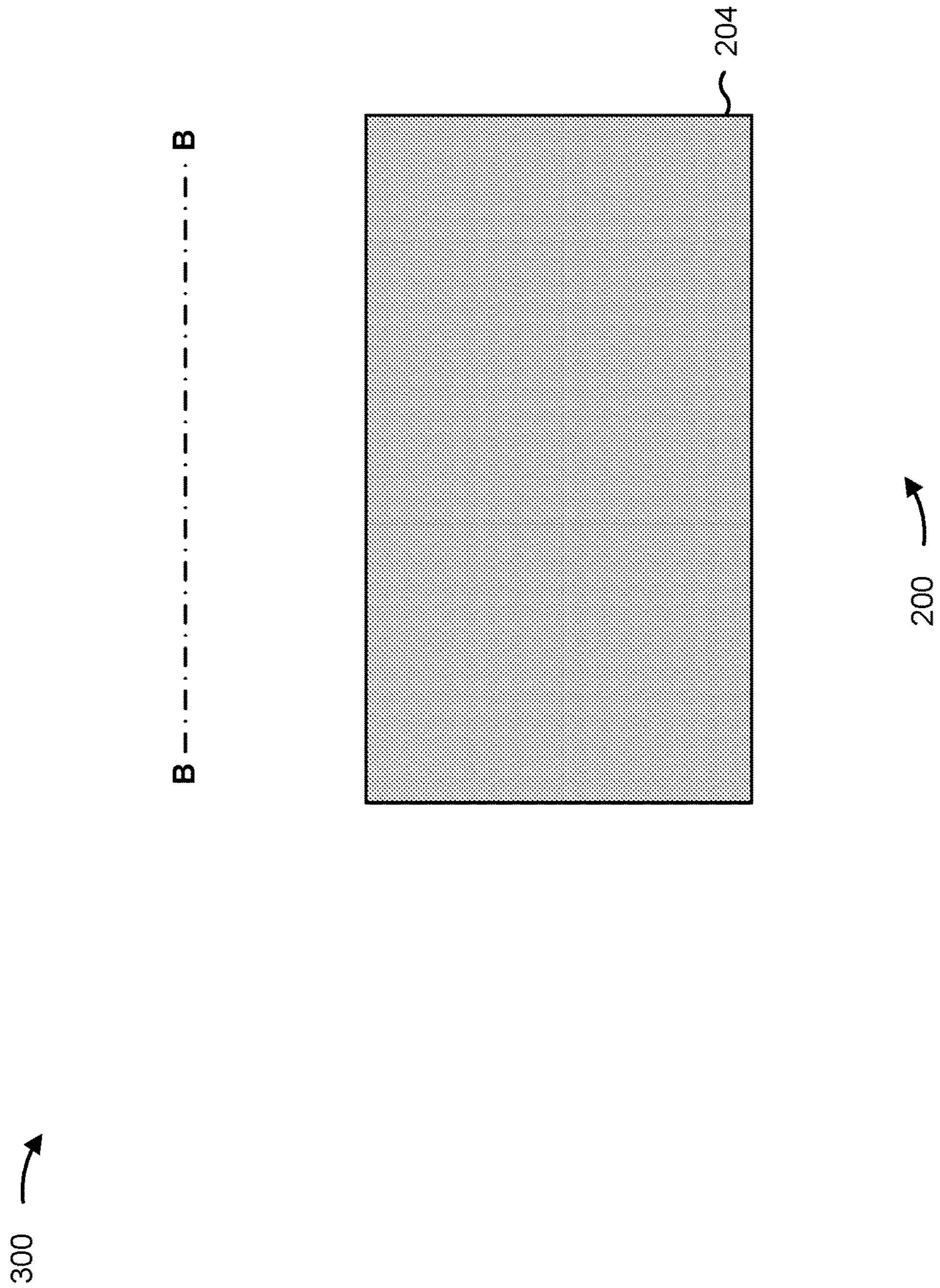
FIGS. 3A-3D are diagrams of an example implementation described herein.

Turning to FIG. 3A, the example implementation 300 includes semiconductor processing operations relating to the substrate 204 in and/or on which transistors are formed in the semiconductor device 200.

Figure 3B:
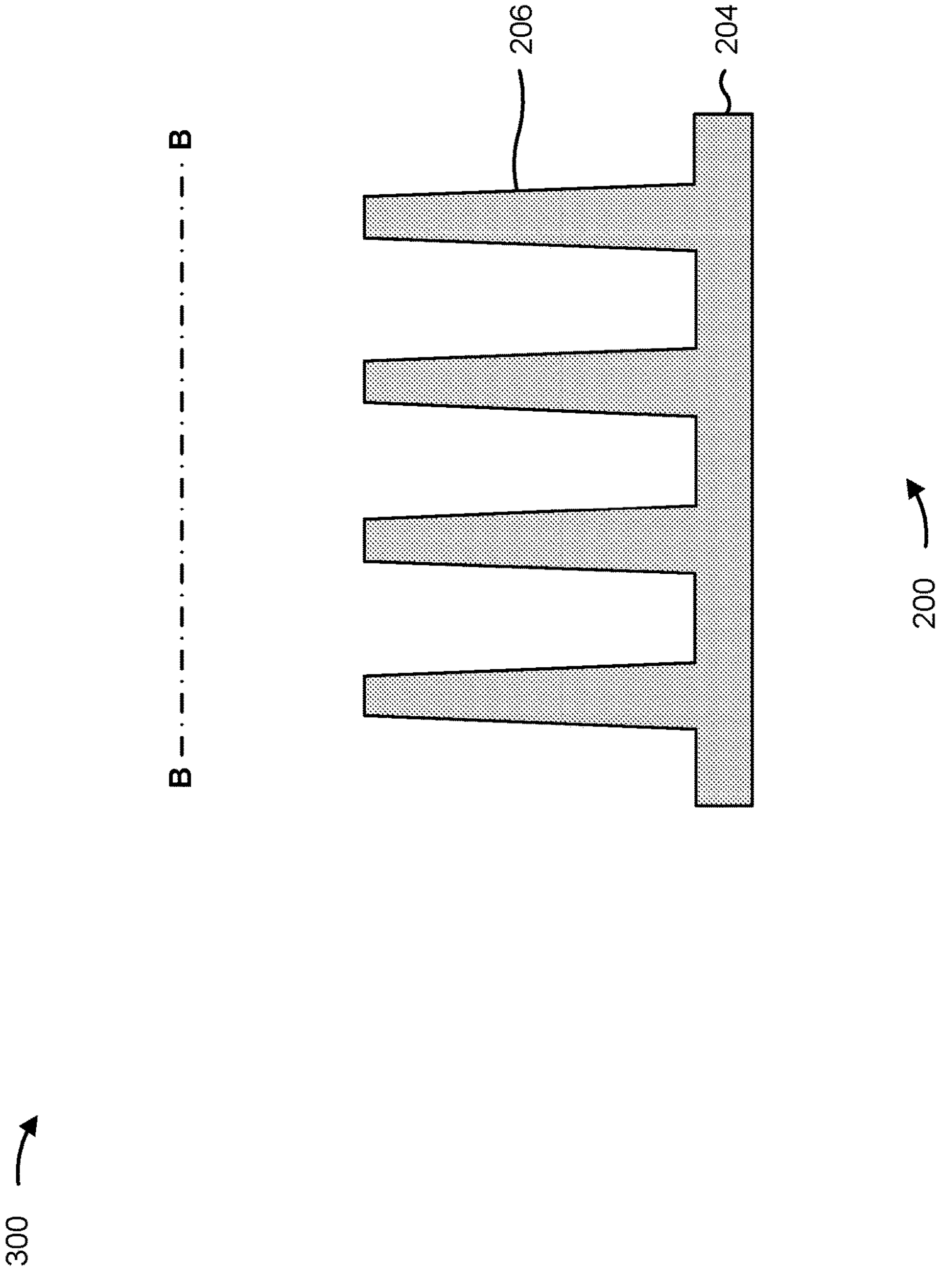

As shown in FIG. 3B, the fin structures 206 are formed in the substrate 204 in the semiconductor device 200. In some implementations, a pattern in a photoresist layer is used to form the fin structures 206. In these implementations, the deposition tool 102 forms the photoresist layer on the substrate 204. The exposure tool 104 exposes the photoresist layer to a radiation source to pattern the photoresist layer. The developer tool 106 develops and removes portions of the photoresist layer to expose the pattern. The etch tool 108 etches into the substrate 204 to form the fin structures 206. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the fin structures 206 based on a pattern.

Figure 3C:
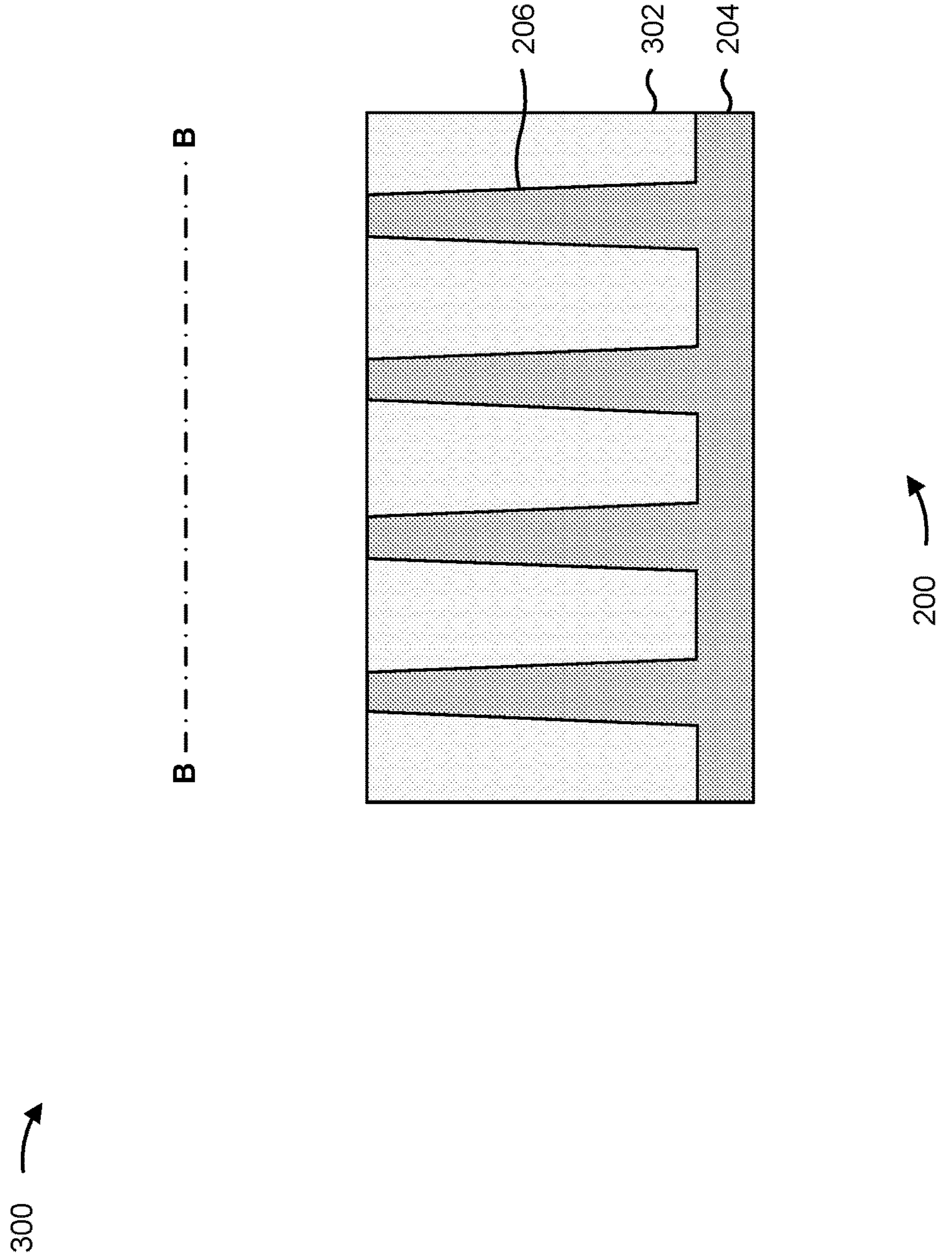

As shown in FIG. 3C, an STI layer 302 is formed in between the fin structures 206. The deposition tool 102 deposits the STI layer 302 using a CVD technique, a PVD technique, an ALD technique, a deposition technique described above in connection with FIG. 1, and/or another deposition technique. In some implementations, the STI layer 302 is formed to a height that is greater than the height of the fin structures 206. In these implementations, the planarization tool 110 performs a planarization (or polishing) operation to planarize the STI layer 302 such that the top surface of the STI layer 302 is substantially flat and smooth, and such that the top surface of the STI layer 302 and the top surface of the fin structures 206 are approximately the same height. The planarization operation may increase uniformity in the STI regions 208 that are formed from the STI layer 302 in a subsequent etch-back operation.

Figure 3D:
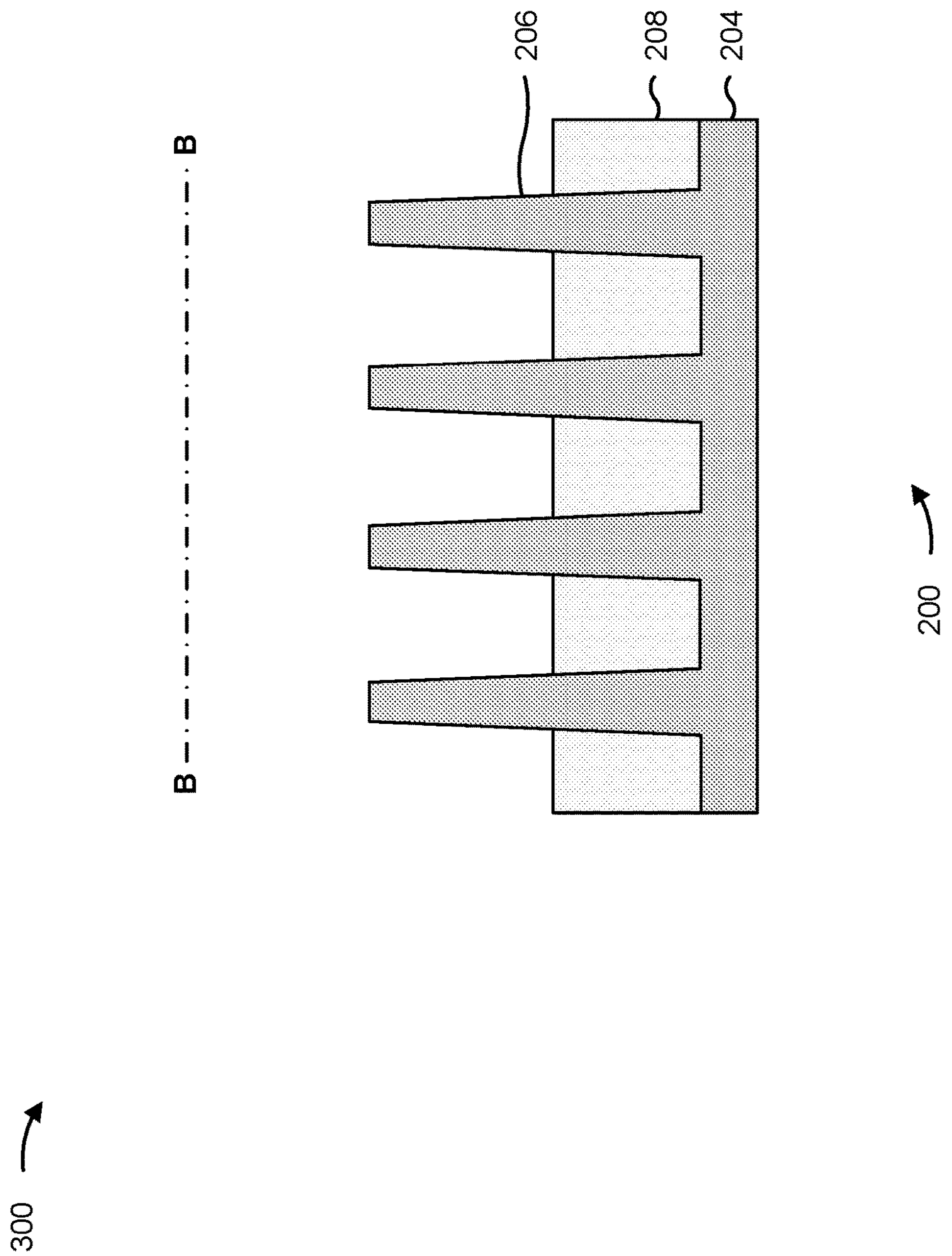

As shown in FIG. 3D, the STI layer 302 is etched in an etch back operation to expose portions of the fin structures 206. The etch tool 108 etches a portion of the STI layer 302 using a plasma etch technique, a wet chemical etch technique, and/or another type of etch technique. The remaining portions of the STI layer 302 between the fin structures 206 include the STI regions 208. In some implementations, the STI layer 302 is etched such that the height of the exposed portions of the fin structures 206 (e.g., the portions of the fin structures 206 that are above the top surface of the STI regions 208) are at the same height in the semiconductor device 200. In some implementations, a first portion of the STI layer 302 in the semiconductor device 200 is etched and a second portion of the STI layer 302 in the semiconductor device 200 is etched such that the height of exposed portions of a first subset of the fin structures 206 and the height of the exposed portions of a second subset of the fin structures 206 are different, which enables the fin heights to be tuned to achieve particular performance characteristics for the semiconductor device 200.

As indicated above, FIGS. 3A-3D are provided as an example. Other examples may differ from what is described with regard to FIGS. 3A-3D.

Figure 4A:
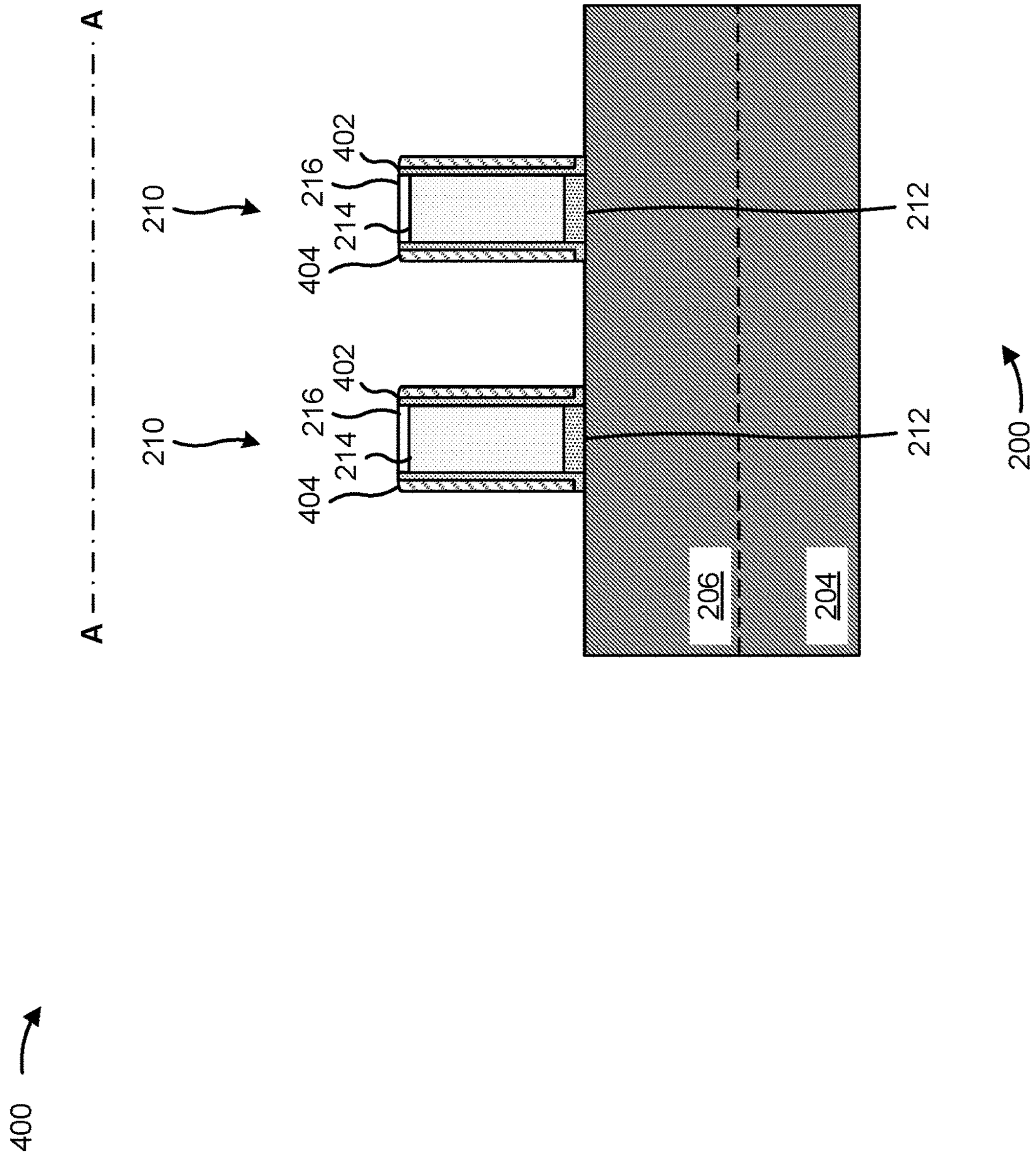
FIGS. 4A-4C are diagrams of an example implementation of forming source/drain regions in source/drain areas of a semiconductor device described herein.
Figure 4B:
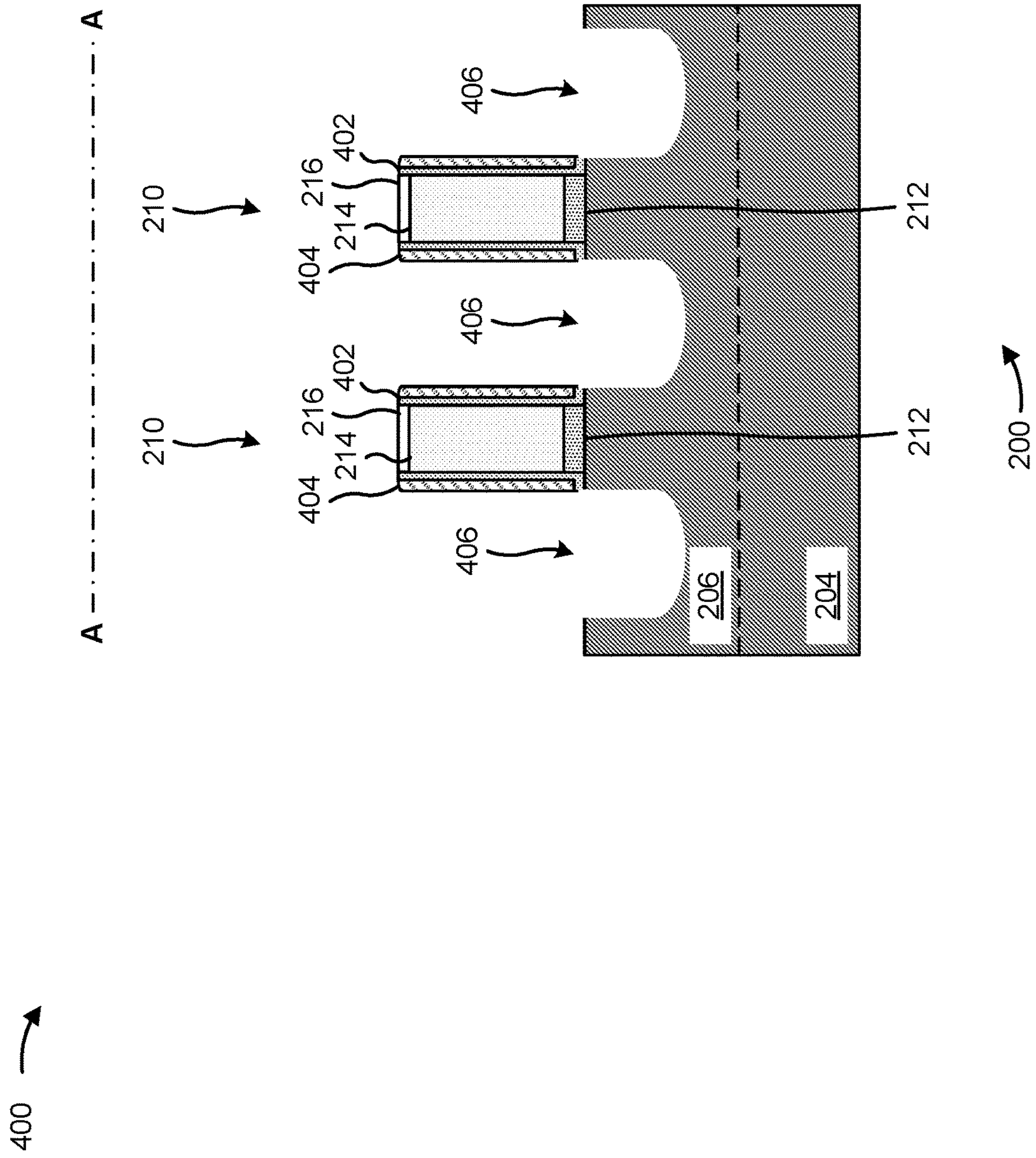
Figure 4C:
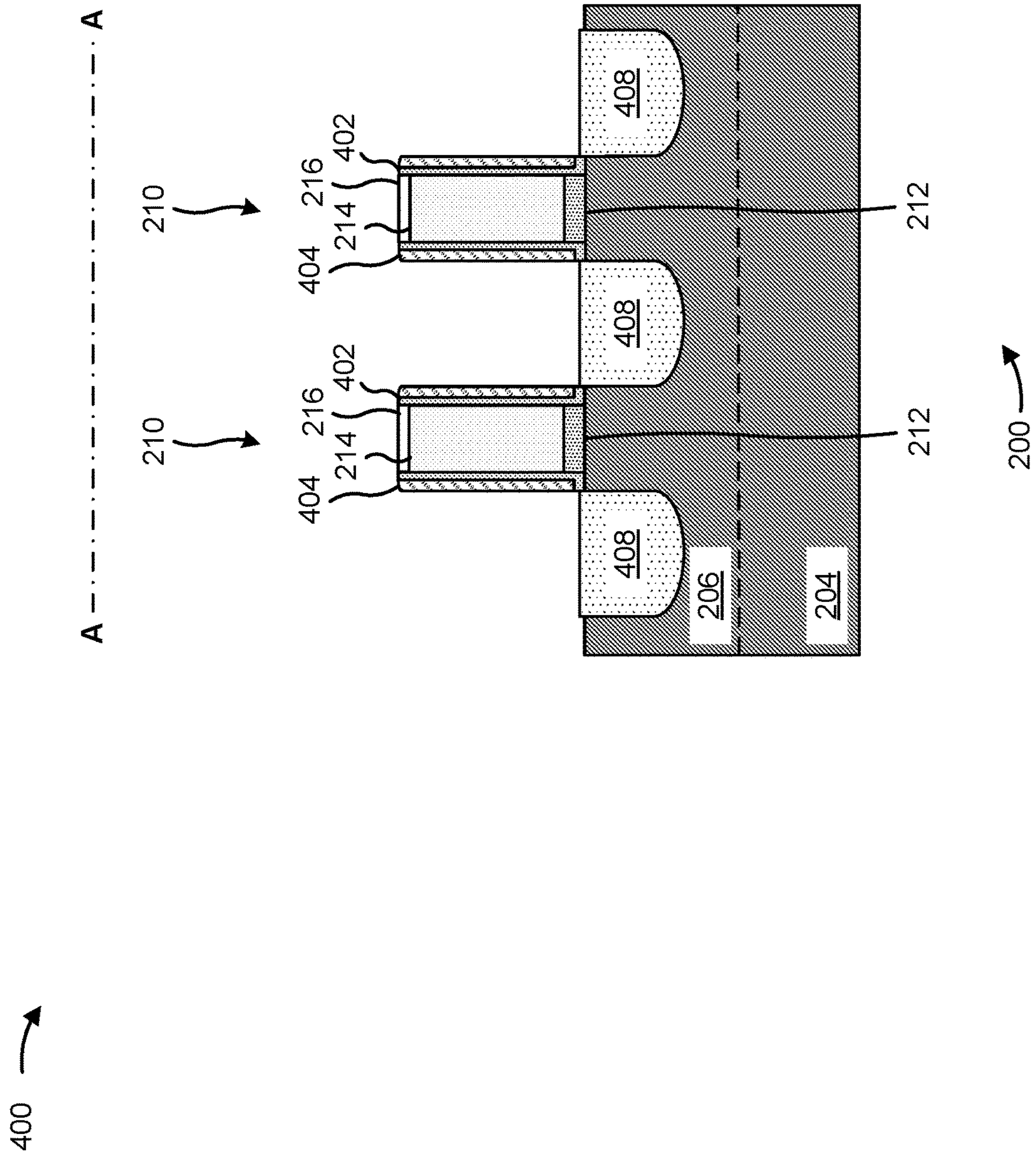

FIGS. 4A-4C are diagrams of an example implementation 400 of forming source/drain regions in source/drain areas 218 of a semiconductor device 200 described herein. FIGS. 4A-4C are illustrated from the perspective of the cross-sectional plane A-A in FIG. 2 for the semiconductor device 200.

In some implementations, the operations described in connection with the example implementation 400 are performed after the fin formation process described in connection with FIGS. 3A-3D. In some implementations, one or more of the semiconductor processing operations described in connection with FIGS. 4A-4C are performed by one or more of the semiconductor processing tools 102-112 and/or the wafer/die transport tool 114 described in connection with FIG. 1. In some implementations, one or more of the semiconductor processing operations described in connection with FIGS. 4A-4C are performed by one or more of the semiconductor processing tools not shown in FIG. 1.

As shown in FIG. 4A, dummy gate structures 210 are formed in the semiconductor device 200. The dummy gate structures 210 are formed and included over the fin structures 206, and around the sides of the fin structures 206 such that the dummy gate structures 210 surround the fin structure 206 on at least three sides of the fin structure 206. The dummy gate structures 210 are formed as placeholders for the actual gate structures (e.g., replacement high-k gate structures or metal gate structures) that are to be formed for the transistors included in the semiconductor device 200. The dummy gate structures 210 may be formed as part of a replacement gate process, which enables other layers and/or structures to be formed prior to formation of the replacement gate structures.

The dummy gate structures 210 include gate dielectric layers 212, gate electrode layers 214, and hard mask layers 216. The gate dielectric layers 212 may each include dielectric oxide layers. As an example, the gate dielectric layers 212 may each be formed (e.g., by the deposition tool 102) by chemical oxidation, thermal oxidation, ALD, CVD, and/or other suitable methods. The gate electrode layers 214 may each include a poly-silicon layer or other suitable layers. For example, the gate electrode layers 214 may be formed (e.g., by the deposition tool 102) by suitable deposition processes such as LPCVD or PECVD, among other examples. The hard mask layers 216 may each include any material suitable to pattern the gate electrode layers 214 with particular dimensions and/or attributes. Examples include silicon nitride, silicon oxynitride, silicon carbon nitride, or a combination thereof, among other examples. The hard mask layers 216 may be deposited (e.g., by the deposition tool 102) by CVD, PVD, ALD, or another deposition technique.

As further shown in FIG. 4A, seal spacer layers 402 are included on the sidewalls of the dummy gate structures 210. The seal spacer layers 402 may be conformally deposited (e.g., by the deposition tool 102) and may include a silicon oxycarbide (SiOC), a nitrogen free SiOC, or another suitable material. The seal spacer layers 402 may be formed by an ALD operation in which various types of precursor gasses including silicon (Si) and carbon (C) are sequentially supplied in a plurality of alternating cycles to form the seal spacer layers 402, among other example deposition techniques.

As further shown in FIG. 4A, gate spacers 404 may be formed on the seal spacer layers 402. The gate spacers 404 may be formed of similar materials as the seal spacer layers 402. However, the gate spacers 404 may formed without plasma surface treatment that is used for the seal spacer layers 402. Moreover, the gate spacers 404 may be formed to a greater thickness relative to the thickness of the seal spacer layers 402.

In some implementations, the seal spacer layers 402 and the gate spacers 404 are conformally deposited (e.g., by the deposition tool 102) on the dummy gate structures 210, and on the fin structures 206. The seal spacer layers 402 and the gate spacers 404 are then patterned (e.g., by the deposition tool 102, the exposure tool 104, and the developer tool 106) and etched (e.g., by the etch tool 108) to remove the seal spacer layers 402 and the gate spacers 404 from the tops of the dummy gate structures 210 and from the fin structures 206.

As shown in FIG. 4B, recesses 406 are formed in the fin structures 206 in the semiconductor device 200 between the dummy gate structures 210 in an etch operation. The etch operation may be referred to a strained source/drain (SSD) etch operation, and the recesses 406 may be referred to as strained source/drain recesses. In some implementations, the etch operation includes a plasma etch technique, a wet chemical etch technique, and/or another type of etch technique.

In some implementations, a plurality of etch operations are performed to form recesses 406 for different types of transistors. For example, a photoresist layer may be formed over and/or on a first subset of the fin structures 206 and over and/or on a first subset of the dummy gate structures 210 such that a second subset of the fin structures 206 between a second subset of the dummy gate structures 210 such that p-type source/drain regions and n-type source/drain regions may be formed in separate epitaxial operations.

As shown in FIG. 4C, source/drain regions 408 are formed in the recesses 406 in the semiconductor device 200 over the substrate 204. The deposition tool 102 forms the source/drain regions 408 by an epitaxial operation, in which layers of the epitaxial material are deposited in the recesses 406 such that the layers of p-type source/drain regions and/or layers of n-type source/drain regions are formed by epitaxial growth in a particular crystalline orientation. The source/drain regions 408 are included between the dummy gate structures 210 and at least partially below and/or lower than the dummy gate structures 210. Moreover, the source/drain regions 408 at least partially extend above the top surface of the fin structures 206.

The material (e.g., silicon (Si), germanium (Ge), gallium (Ga), or another type of semiconductor material) that is used to form the source/drain regions 408 may be doped with a p-type dopant (e.g., a type of dopant that includes electron acceptor atoms that create holes in the material), with an n-type dopant (e.g., a type of dopant that includes electron donor atoms that create mobile electrons in the material), and/or with another type of dopant. The material may be doped by adding impurities (e.g., the p-type dopant, the n-type dopant) to a source gas that is used during the epitaxial operation. Examples of p-type dopants that may be used in the epitaxial operation include boron (B) and/or germanium (Ge), among other examples. The resulting material of p-type source/drain regions include silicon germanium ($Si_xGe_{1-x}$, where x can be in a range from approximately 0 to approximately 100) or another type of p-doped semiconductor material. Examples of n-type dopants that may be used in the epitaxial operation include phosphorous (P), antimony (Sb), and/or arsenic (As), among other examples. The resulting material of n-type source/drain regions include silicon phosphide ($Si_xP_y$) or another type of n-doped semiconductor material.

As indicated above, FIGS. 4A-4C are provided as an example. Other examples may differ from what is described with regard to FIGS. 4A-4C.

FIGS. 5A-5D are diagrams of an example implementation 500 of a dummy gate replacement process for a semiconductor device 200 described herein. The dummy gate replacement process may be performed such that the dummy gate structures 210 are replaced with high-k gate structures and/or metal gate structures (e.g., MGs). FIGS. 5A-5D are illustrated from the perspective of the cross-sectional plane A-A in FIG. 2 for the semiconductor device 200.

In some implementations, the operations described in connection with the example implementation 500 are performed after the source/drain formation process described in connection with FIGS. 4A-4C. In some implementations, one or more of the semiconductor processing operations described in connection with FIGS. 5A-5D are performed by one or more of the semiconductor processing tools 102-112 and/or the wafer/die transport tool 114 described in connection with FIG. 1. In some implementations, one or more of the semiconductor processing operations described in connection with FIGS. 5A-5D are performed by one or more of the semiconductor processing tools not shown in FIG. 1.

Figure 5A:
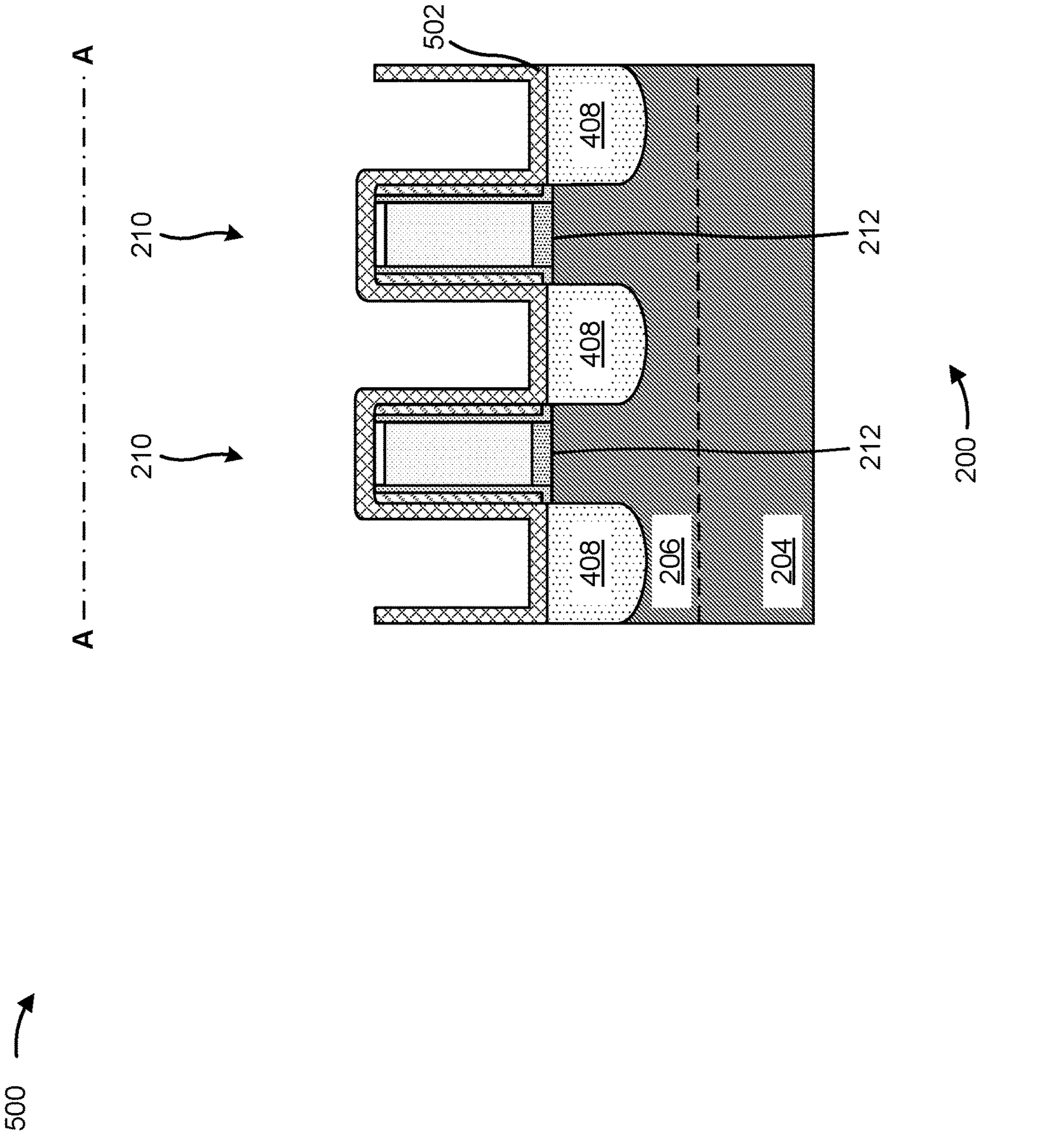
FIGS. 5A-5D are diagrams of an example implementation of a dummy gate replacement process for a semiconductor device described herein.

As shown in FIG. 5A, a bottom contact etch stop layer (B-CESL) 502 is conformally deposited (e.g., by the deposition tool 102) over the source/drain regions 408, over the dummy gate structures 210, and on the sidewalls of the gate spacers 404. The B-CESL 502 may provide a mechanism to stop an etch process when forming contacts or vias for the semiconductor device 200. The B-CESL 502 may be formed of a dielectric material having a relatively high dielectric constant to provide etch selectivity from adjacent layers or components. For example, the material of the B-CESL 502 may have an as-deposited k value that is greater relative to the k value of silicon oxide ($SiO_2$). As another example, the material of the B-CESL 502 may have an as-deposited k value that is greater relative to approximately 3.9, such as between approximately 7.5 and approximately 10.0 or greater, among other examples. The B-CESL 502 may include or may be a nitrogen/nitride containing material, a silicon containing material, and/or a carbon containing material. Furthermore, the B-CESL 502 may include or may be a silicon nitride (SixNy), silicon carbon nitride (SiCN), silicon oxynitride (SiON), silicon oxycarbide (SiOC), or a combination thereof, among other examples. The B-CESL 502 may be deposited using a deposition technique, such as ALD, CVD, or another deposition technique.

Figure 5B:
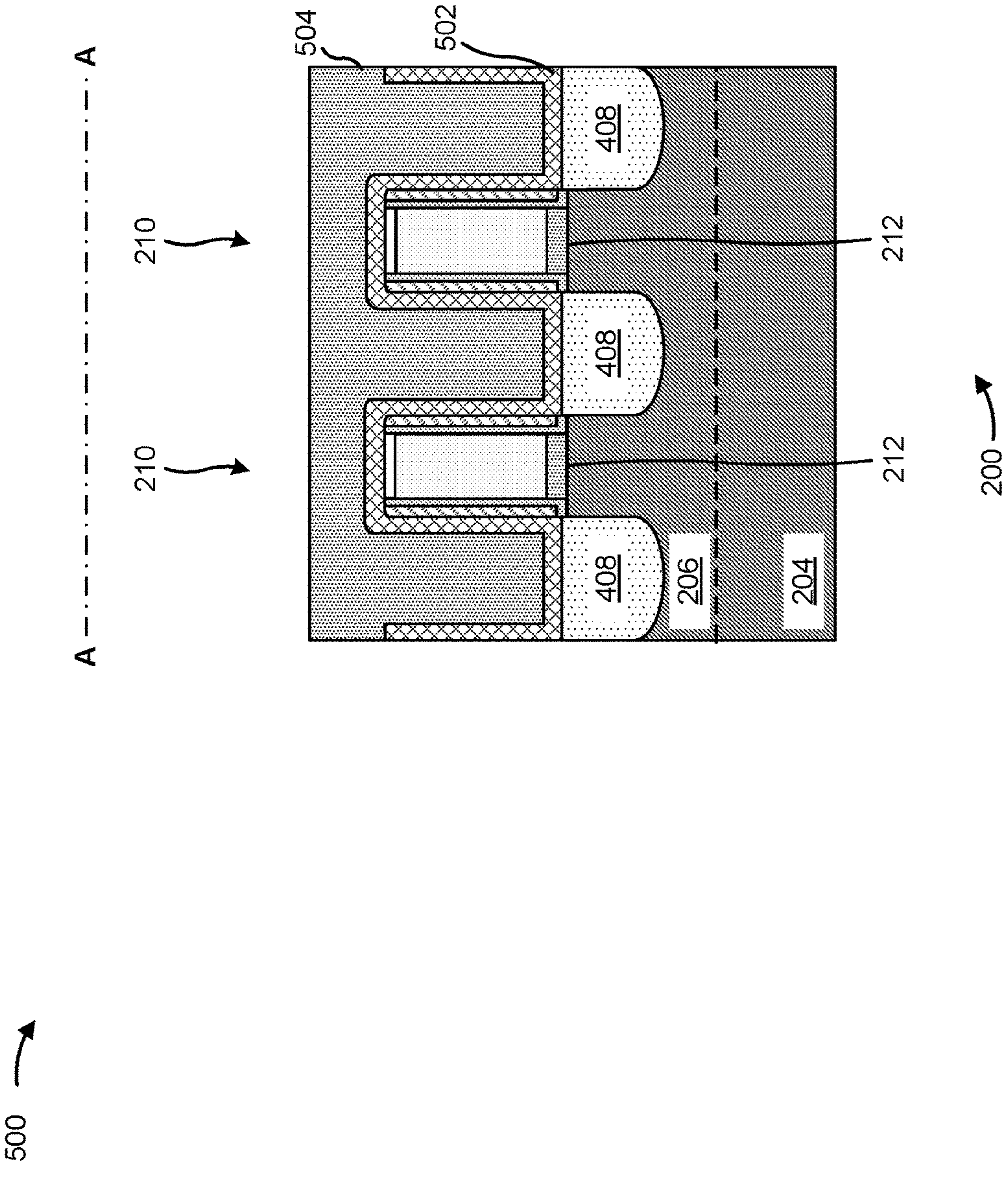

As shown in FIG. 5B, an interlayer dielectric (ILD) layer 504 is formed (e.g., by the deposition tool 102) over and/or on the B-CESL 502. The ILD layer 504 fills in the areas between the dummy gate structures 210 over the source/drain regions 408. The ILD layer 504 is formed to permit a replacement gate structure process to be performed in the semiconductor device 200, in which metal gate structures are formed to replace the dummy gate structures 210. The ILD layer 504 may be referred to as an ILD zero (ILD0) layer.

In some implementations, the ILD layer 504 is formed to a height (or thickness) such that the ILD layer 504 covers the dummy gate structures 210. In these implementations, a subsequent CMP operation (e.g., performed by the planarization tool 110 is performed to planarize the ILD layer 504 such that the top surfaces of the ILD layer 504 are approximately at a same height as the top surfaces of the dummy gate structures 210. The increases the uniformity of the ILD layer 504.

Figure 5C:
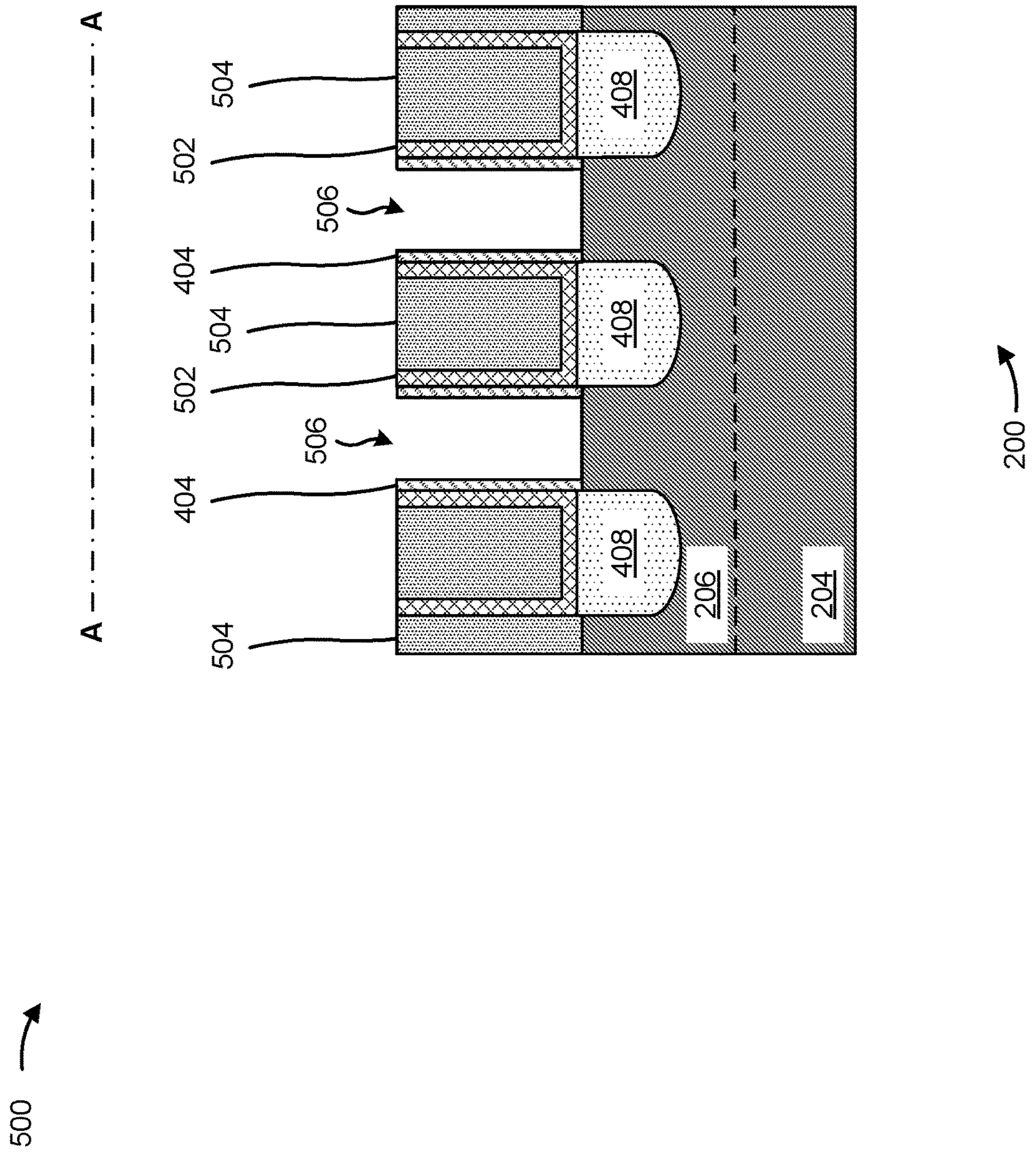

As shown in FIG. 5C, the replacement gate operation is performed (e.g., by one or more of the semiconductor processing tools 102-112) to remove the dummy gate structures 210 from the semiconductor device 200. The removal of the dummy gate structures 210 leaves behind recesses 506 between the gate spacers 404 and between the source/drain regions 408. The dummy gate structures 210 may be removed in one or more etch operations includes a plasma etch technique, which may include a wet chemical etch technique, and/or another type of etch technique.

Figure 5D:
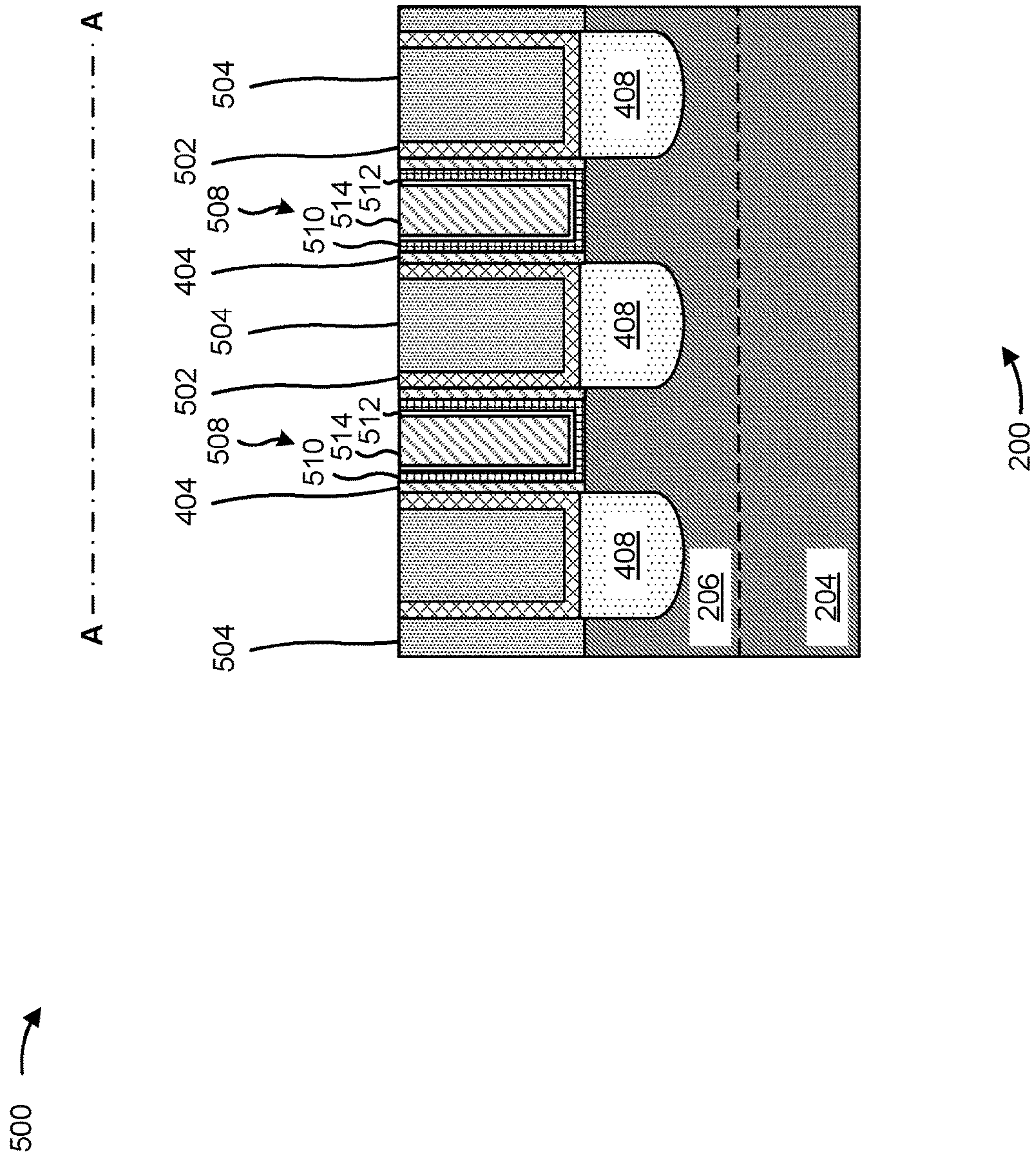

As shown in FIG. 5D, the replacement gate operation continues where deposition tool 102 and/or the plating tool 112 forms the gate structures (e.g., replacement gate structures, high-k/metal gate structures) 508 in the recesses 506 between the gate spacers 404 and between the source/drain regions 408. The gate structures 508 may include metal gate structures, high-k gate structures, or other types of gate structures. The gate structures 508 may include an interfacial layer (not shown), a high-k dielectric layer 510, a work function tuning layer 512, and a metal electrode structure 514 formed therein to form a gate structure 508. In some implementations, the gate structures 508 may include other compositions of materials and/or layers.

As indicated above, FIGS. 5A-5D are provided as an example. Other examples may differ from what is described with regard to FIGS. 5A-5D.

FIGS. 6A-6I are diagrams of an example implementation 600 of forming source/drain contacts (e.g., metal drains or MDs) of a semiconductor device 200 described herein. FIGS. 6A-6I are illustrated from the perspective of the cross-sectional plane A-A in FIG. 2 for the semiconductor device 200.

In some implementations, the operations described in connection with the example implementation 600 are performed after the dummy gate replacement process described in connection with FIGS. 5A-5D. In some implementations, one or more of the semiconductor processing operations described in connection with FIGS. 6A-6I are performed by one or more of the semiconductor processing tools 102-112 and/or the wafer/die transport tool 114 described in connection with FIG. 1. In some implementations, one or more of the semiconductor processing operations described in connection with FIGS. 6A-6I are performed by one or more of the semiconductor processing tools not shown in FIG. 1.

Figure 6A:
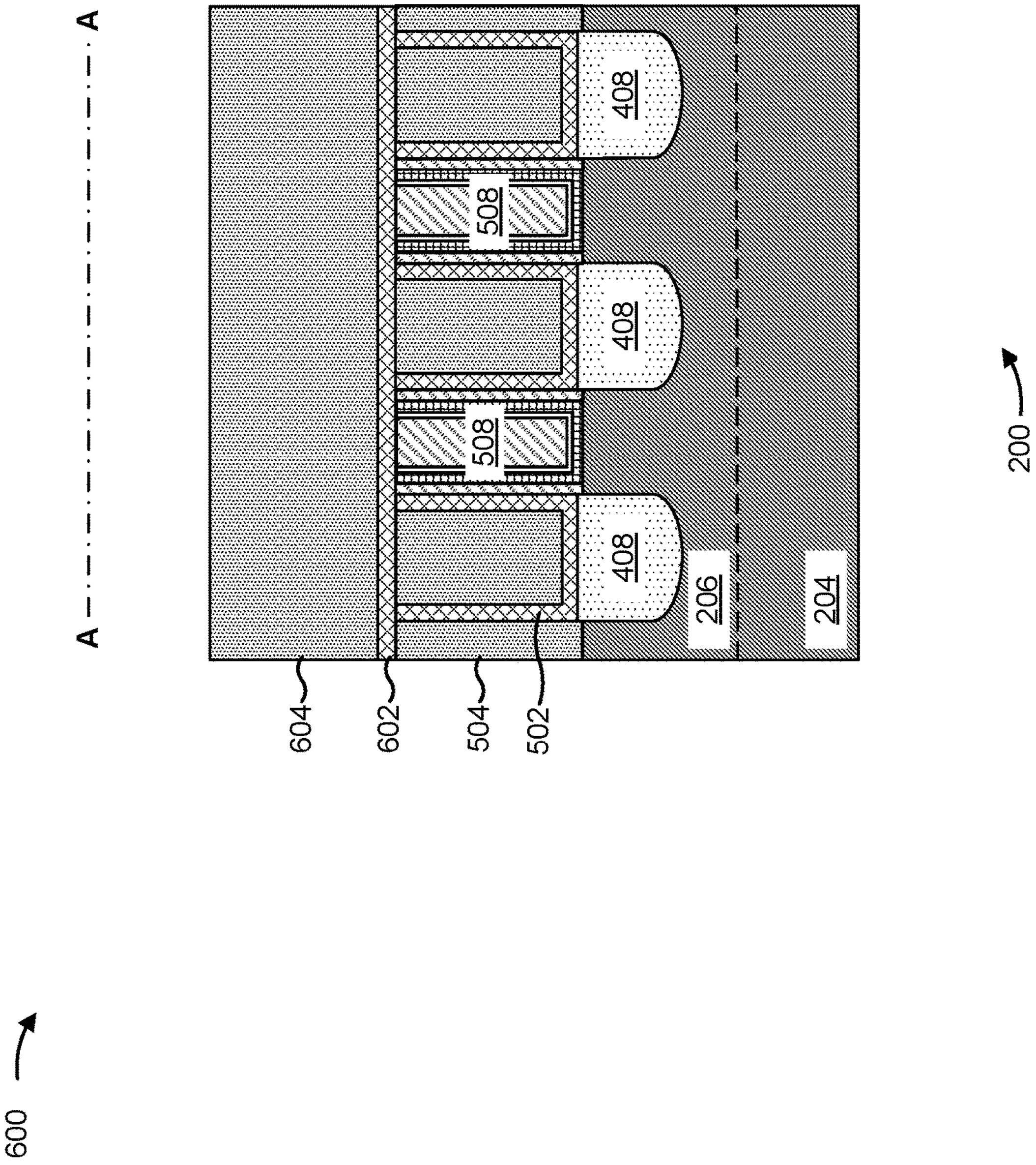
FIGS. 6A-6I are diagrams of an example implementation of forming source/drain contacts of a semiconductor device described herein.

As shown in FIG. 6A, one or more dielectric layers may be formed on the semiconductor device 200. For example, a contact etch stop layer (CESL) 602 may be formed over and/or on the ILD layer 504, and an ILD layer 604 (e.g., an ILD1 layer) may be formed over and/or on the CESL 602. The deposition tool 102 may deposit the CESL 602 in a PVD operation, an ALD operation, a CVD operation, an oxidation operation, another type of deposition operation described in connection with FIG. 1, and/or another suitable deposition operation. In some implementations, the planarization tool 110 planarizes the CESL 602 after the deposition tool 102 deposits the CESL 602. The deposition tool 102 may deposit the ILD layer 604 in a PVD operation, an ALD operation, a CVD operation, an epitaxy operation, an oxidation operation, another type of deposition operation described in connection with FIG. 1, and/or another suitable deposition operation. In some implementations, the planarization tool 110 planarizes the ILD layer 604 after the deposition tool 102 deposits the ILD layer 604.

Figure 6B:
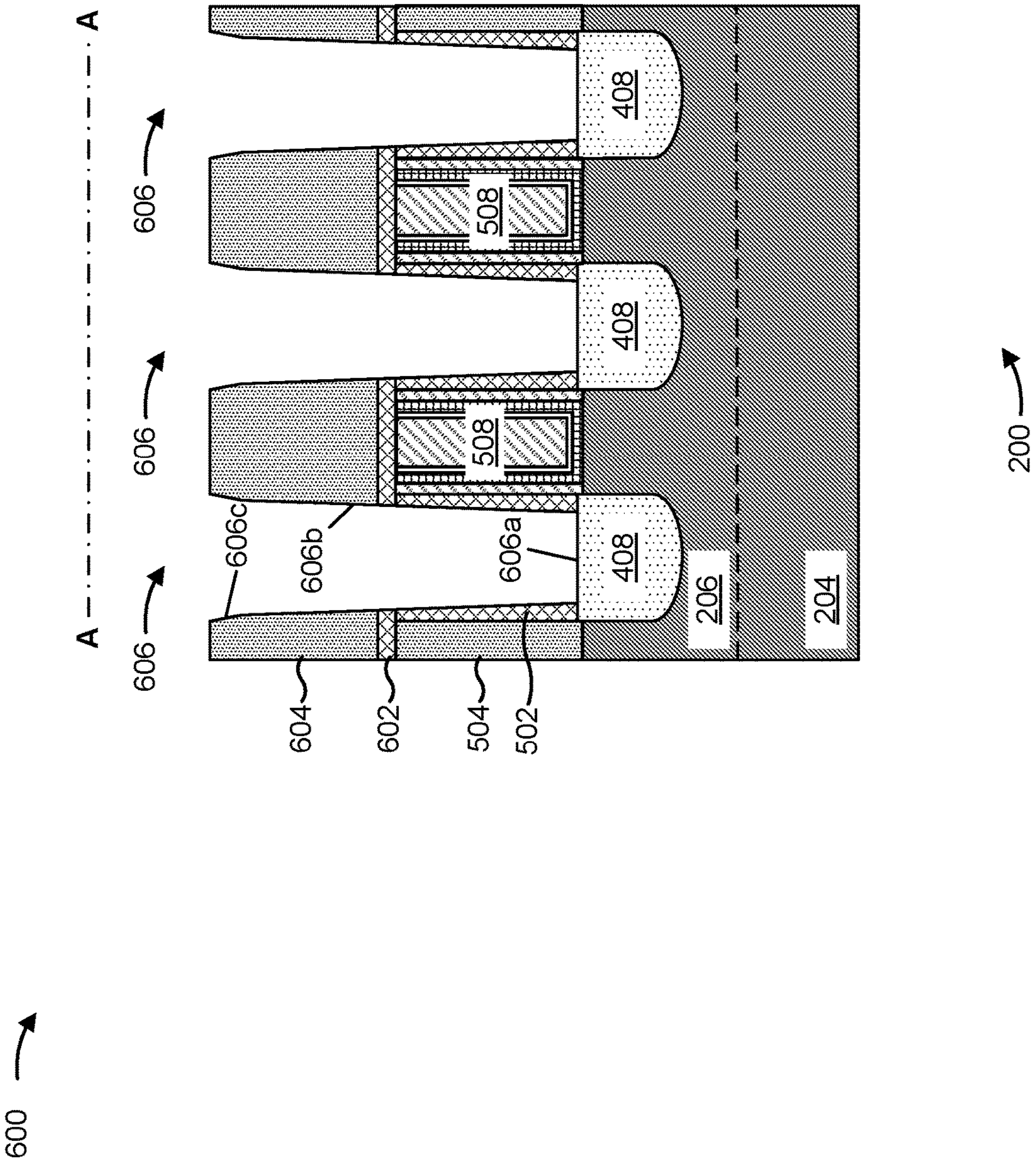

As shown in FIG. 6B, recesses 606 are formed through one or more dielectric layers and to the source/drain regions 408. In particular, the ILD layer 604, the CESL 602, the ILD layer 504, and the B-CESL 502 between the gate structures 508 in the semiconductor device 200 may be etched to form the recesses 606 between the gate structures 508 and to the source/drain regions 408. Top surfaces of the source/drain regions 408 are exposed through the recesses 606. A recess 606 includes a bottom surface 606*a* corresponding to a top surface of an associated source/drain region 408, and a plurality of sidewalls 606*b* and 606*c* corresponding to sides of the B-CESL 502, the CESL 602, and/or the ILD layer 604.

In some implementations, a pattern in a photoresist layer is used to form the recesses 606. In these implementations, the deposition tool 102 forms the photoresist layer on the ILD layer 504, and on the gate structures 508. The exposure tool 104 exposes the photoresist layer to a radiation source to pattern the photoresist layer. The developer tool 106 develops and removes portions of the photoresist layer to expose the pattern. The etch tool 108 etches into the ILD layer 604, the CESL 602, the ILD layer 504, and/or the B-CESL 502 to form the recesses 606. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the recesses 606 based on a pattern.

In some implementations, the sidewalls 606*b* and 606*c* may be angled (e.g., at an angle greater than approximately 90 degrees) such that the sidewalls 606*b* and 606*c* on opposing sides of the recesses 606 taper between a top of the openings of the recesses 606 and the bottom surfaces 606*a* of the recesses 606. In these implementations, the width of the recesses 606 may be greater at a top of the recesses 606 relative to the width of the recesses 606 at the bottom surfaces 606*a* of the recesses. In some implementations, an angle of the sidewalls 606*c* may be greater relative to an angle of the sidewalls 606*b*. Additionally and/or alternatively, some recesses 606 may have approximately straight (e.g., 90 degree) sidewalls 606*b* and 606*c*.

Figure 6C:
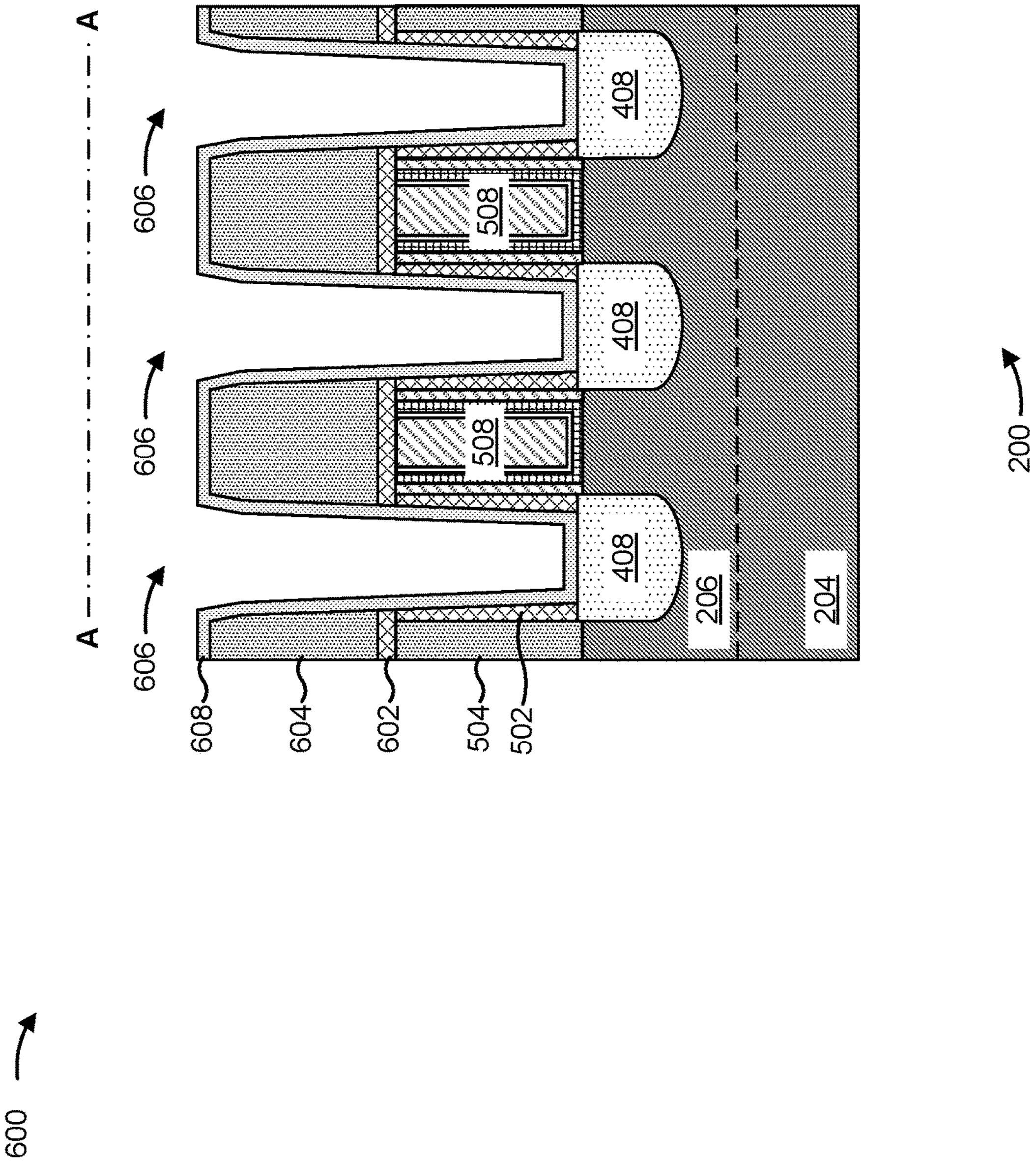

As shown in FIG. 6C, a source/drain contact liner 608 may be formed in the recesses 606 (e.g., over the bottom surfaces 606*a* and on the sidewalls 606*b* and 606*c*). For example, the source/drain contact liner 608 may be formed on a top surface of a source/drain region 408 exposed in a recess 606. As another example, the source/drain contact liner 608 may be formed on portions of a B-CESL 502 exposed in the recess 606. As another example, the source/drain contact liner 608 may be formed on portions of the CESL 602 exposed in the recess 606. As another example, the source/drain contact liner 608 may be formed on portions of the ILD layer 604 exposed in the recess 606. In some implementations, the source/drain contact liner 608 may be formed on the top surface of the ILD layer 604.

The deposition tool 102 may deposit the material of the source/drain contact liner 608 in a PVD operation, an ALD operation, a CVD operation, an epitaxy operation, an oxidation operation, another type of deposition operation described in connection with FIG. 1, and/or another suitable deposition operation. The deposition tool 102 may conformally deposit the material of the source/drain contact liner 608 such that the source/drain contact liner 608 conforms to the shape or profile of the recesses 606. The material of the source/drain contact liner 608 may include a silicon nitride (SixNy), silicon carbon nitride (SiCN), silicon carbide (SiC), another high dielectric constant material having a k value that is greater than approximately 3.9, or a combination thereof, among other examples.

Figure 6D:
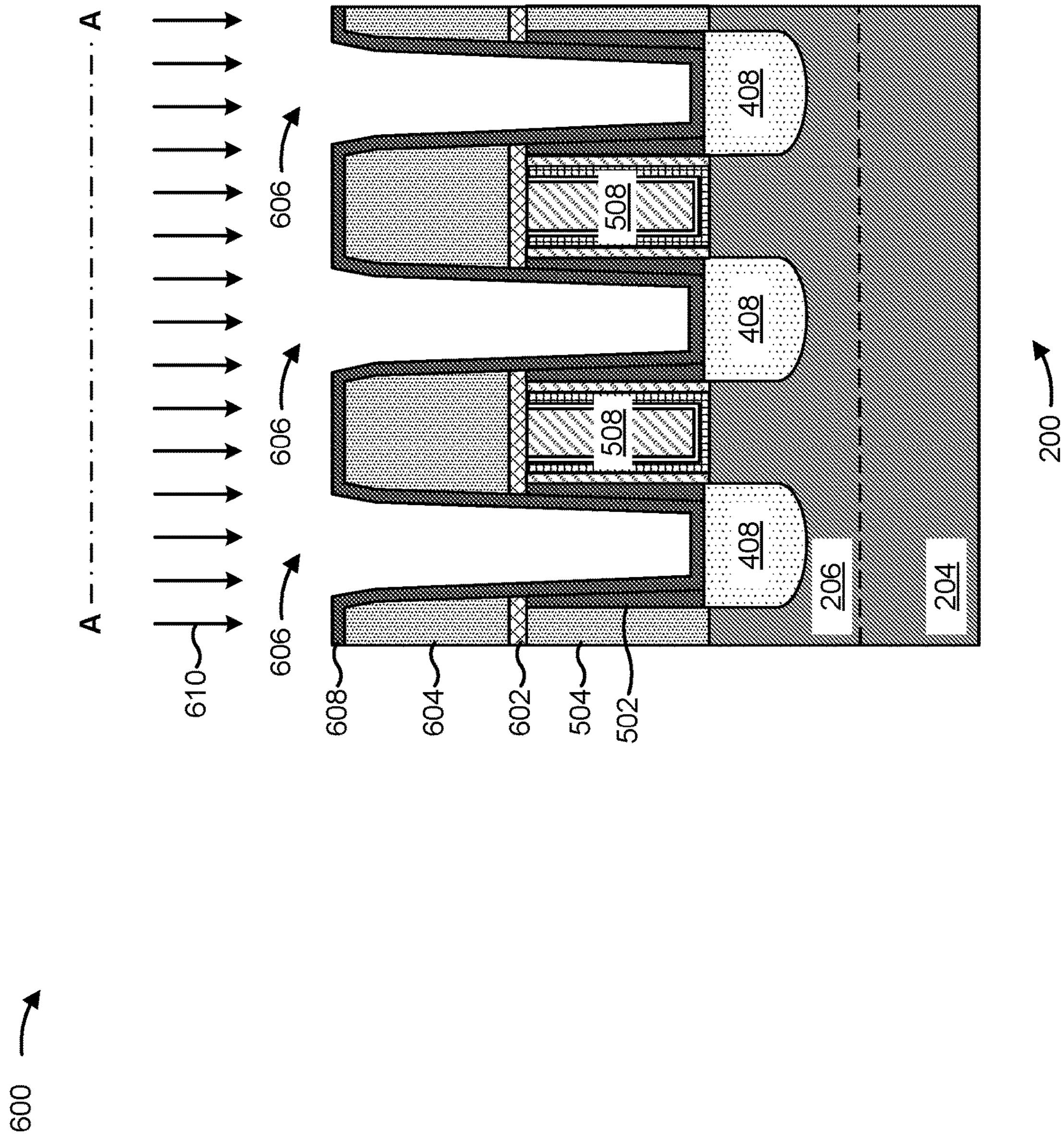

As shown in FIG. 6D, an oxidation treatment operation may be performed using an oxidation treatment gas 610 to oxidize the source/drain contact liner 608 and/or the B-CESL 502 adjacent to the source/drain contact liner 608. The oxidation treatment operation may be performed to reduce the dielectric constant (e.g., the k value) of the source/drain contact liner 608 and/or of the B-CESL 502 adjacent to the source/drain contact liner 608. After the oxidation treatment operation, the source/drain contact liner 608 and/or the B-CESL 502 adjacent to the source/drain contact liner 608 may include a silicon oxynitride (SiON), silicon oxy-carbon-nitride (SiOCN), silicon oxynitride (SiON), silicon oxycarbide (SiOC), and/or another oxidized dielectric material.

Reducing the dielectric constant of the source/drain contact liner 608 and/or of the B-CESL 502 may reduce the likelihood of and/or the amount of parasitic capacitance between the gate structures 508 and adjacent source/drain contacts that are to be formed in the recesses 606. The amount of parasitic capacitance CP between a gate structure 508 and an adjacent source/drain contact may be represented as:

$$C_P = k\frac{A}{d}$$

where k represents the dielectric constant (e.g., the k value) of the dielectric layers (e.g., the gate spacer 404, the B-CESL 502, the source/drain contact liner 608) between the gate structure 508 and the adjacent source/drain contact; A represents the surface area interface between the gate structure 508 and the adjacent source/drain contact; and drepresents the distance between the gate structure 508 and the adjacent source/drain contact. Thus, the parasitic capacitance CP between a gate structure 508 and an adjacent source/drain contact may be directly proportional to the dielectric constant of the dielectric layers between the gate structure 508 and the adjacent source/drain contact. Accordingly, performing the oxidation treatment operation to reduce the dielectric constant of the source/drain contact liner 608 and/or of the B-CESL 502 may reduce the parasitic capacitance CP between a gate structure 508 and an adjacent source/drain contact.

The oxidation treatment operation may include providing the oxidation treatment gas 610 into the recesses 606 so that oxygen atoms in the oxidation treatment gas 610 diffuse into the source/drain contact liner 608 and/or the B-CESL 502, thereby increasing the oxygen concentration (and reducing the dielectric constant) of the material of the source/drain contact liner 608 and/or of the material of the B-CESL 502. The oxidation treatment gas 610 may include ozone ($O_3$), oxygen ($O_2$), and/or another oxygen-containing gas. The oxidation treatment gas 610 may include one or more additional gasses (e.g., carrier gasses, plasma reactant gasses), such as hydrogen ($H_2$), nitrogen ($N_2$), and/or argon (Ar), among other examples.

In some implementations, the deposition tool 102 may provide the oxidation treatment gas 610 into the recesses 606 in the oxidation treatment operation. The deposition tool 102 may control the flow of the oxidation treatment gas 610 into the recesses 606 and/or facilitate the reaction between the oxidation treatment gas 610 and the source/drain contact liner 608 and/or the B-CESL 502 using a plasma. The plasma may include an argon-based plasma, a hydrogen-based plasma, a nitrogen-based plasma, and/or another type of plasma. The deposition tool 102 may remotely generate the plasma (e.g., outside of a processing chamber in which the semiconductor device 200 is located), may generate the plasma using an inductively coupled plasma (ICP) technique, and/or may generate the plasma using a capacitively coupled plasma (CCP) technique, among other examples.

In some implementations, the deposition tool 102 may increase the temperature of the semiconductor device 200 such that the temperature of the semiconductor device 200 is included in a range of approximately 50 degrees Celsius to approximately 100 degrees Celsius. If the temperature is less than approximately 50 degrees Celsius, the reaction between the oxidation treatment gas 610 and the source/drain contact liner 608 and/or the B-CESL 502 may not occur. If the temperature is greater than approximately 450 degrees Celsius, the high temperature may cause damage to other structures of the semiconductor device 200, such as the gate structures 508. However, other values for the range are within the scope of the present disclosure.

In some implementations, the deposition tool 102 may perform the oxidation treatment operation at a pressure in the processing chamber that is included in a range of approximately 1 millitorr to approximately 10 torr. If the pressure is less than approximately 1 millitorr or greater than approximately 10 torr, the deposition tool 102 may not be able to effectively control the flow of the oxidation treatment gas 610 into the recesses 606 using the plasma. However, other values for the range are within the scope of the present disclosure.

In some implementations, the deposition tool 102 may perform the oxidation treatment operation using a plasma bias power that is included in a range of approximately 200 watts to approximately 4000 watts. If the plasma bias power is less than approximately 200 watts, the reaction between the oxidation treatment gas 610 and the source/drain contact liner 608 and/or the B-CESL 502 may not occur. If the plasma bias power is greater than approximately 4000 watts the bombardment energy of the plasma may cause ion penetration through the source/drain contact liner 608, which may result in damage to the source/drain regions 408 under the source/drain contact liner 608. However, other values for the range are within the scope of the present disclosure.

In some implementations, the deposition tool 102 may perform the oxidation treatment operation for a time duration that is included in a range of approximately 5 seconds to approximately 600 seconds. If the time duration is less than approximately 5 seconds, the time duration may be too short to sufficiently increase the oxygen concentration in the B-CESL 502 and/or the source/drain contact liner 608. If the time duration is greater than approximately 600 seconds, oxidation may occur in the source/drain regions 408, which may result in damage to the source/drain regions 408. However, other values for the range are within the scope of the present disclosure.

Figure 6E:
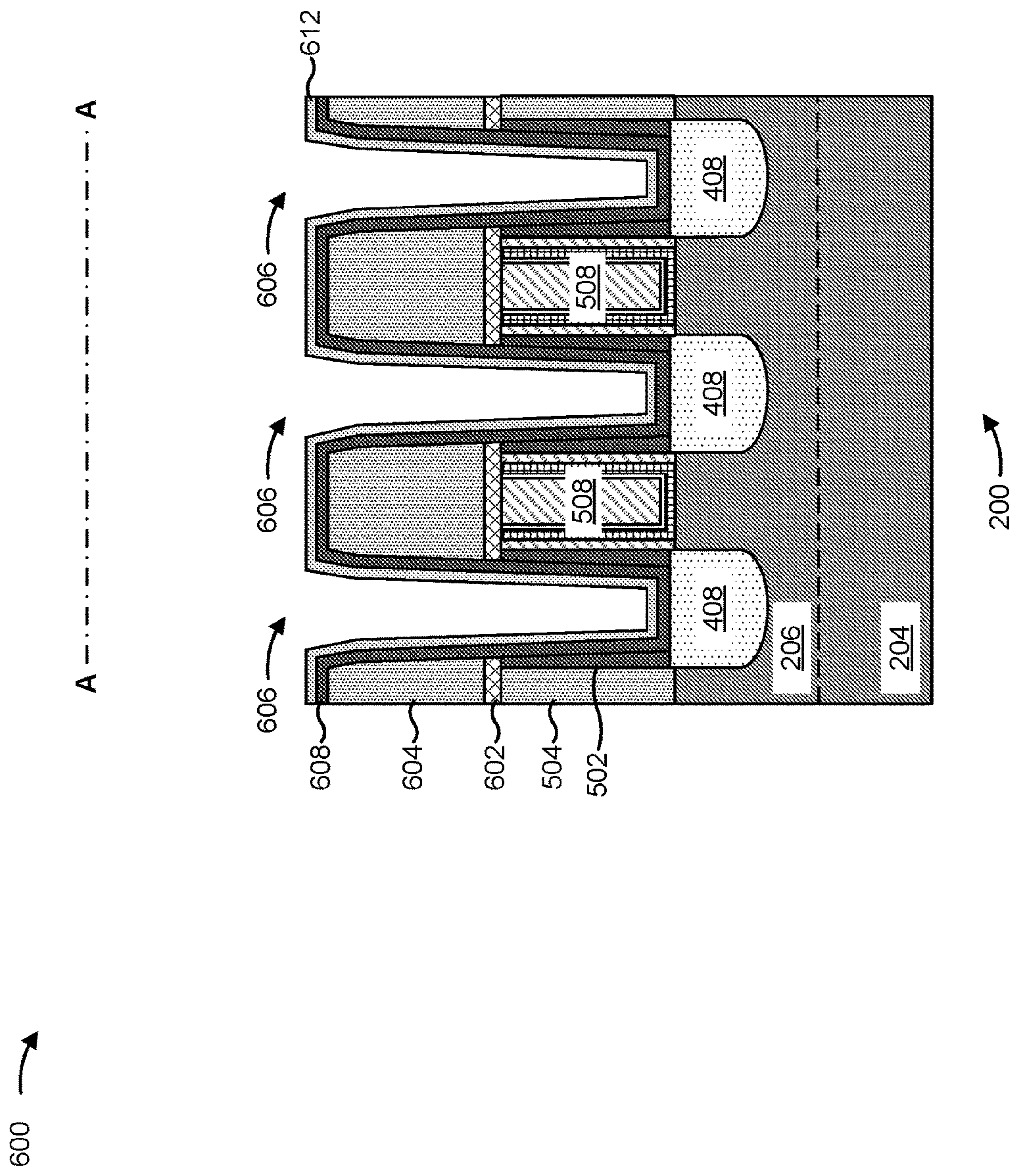

As shown in FIG. 6E, a source/drain contact liner 612 may be formed in the recesses 606 (e.g., over the bottom surfaces 606*a* and on the sidewalls 606*b* and 606*c*) on the source/drain contact liner 608. In particular, the source/drain contact liner 612 may be formed in the recesses 606 after the oxidation treatment operation is performed. The material of the source/drain contact liner 612 may include a high dielectric constant material to provide etch selectivity and/or to withstand subsequent semiconductor processing operation. Forming the source/drain contact liner 612 after the oxidation treatment operation enables the source/drain contact liner 612 to retain the high dielectric constant properties of the as-deposited material for the source/drain contact liner 612.

The deposition tool 102 may deposit the material of the source/drain contact liner 612 in a PVD operation, an ALD operation, a CVD operation, an oxidation operation, another type of deposition operation described in connection with FIG. 1, and/or another suitable deposition operation. The deposition tool 102 may conformally deposit the material of the source/drain contact liner 612 such that the source/drain contact liner 612 conforms to the shape or profile of the recesses 606. The material of the source/drain contact liner 612 may include a silicon nitride ($Si_xN_y$), silicon carbon nitride (SiCN), silicon oxy-carbon-nitride (SiOCN), silicon oxycarbide (SiOC), another high dielectric constant material having a k value that is greater than approximately 3.9, or a combination thereof, among other examples.

Figure 6F:
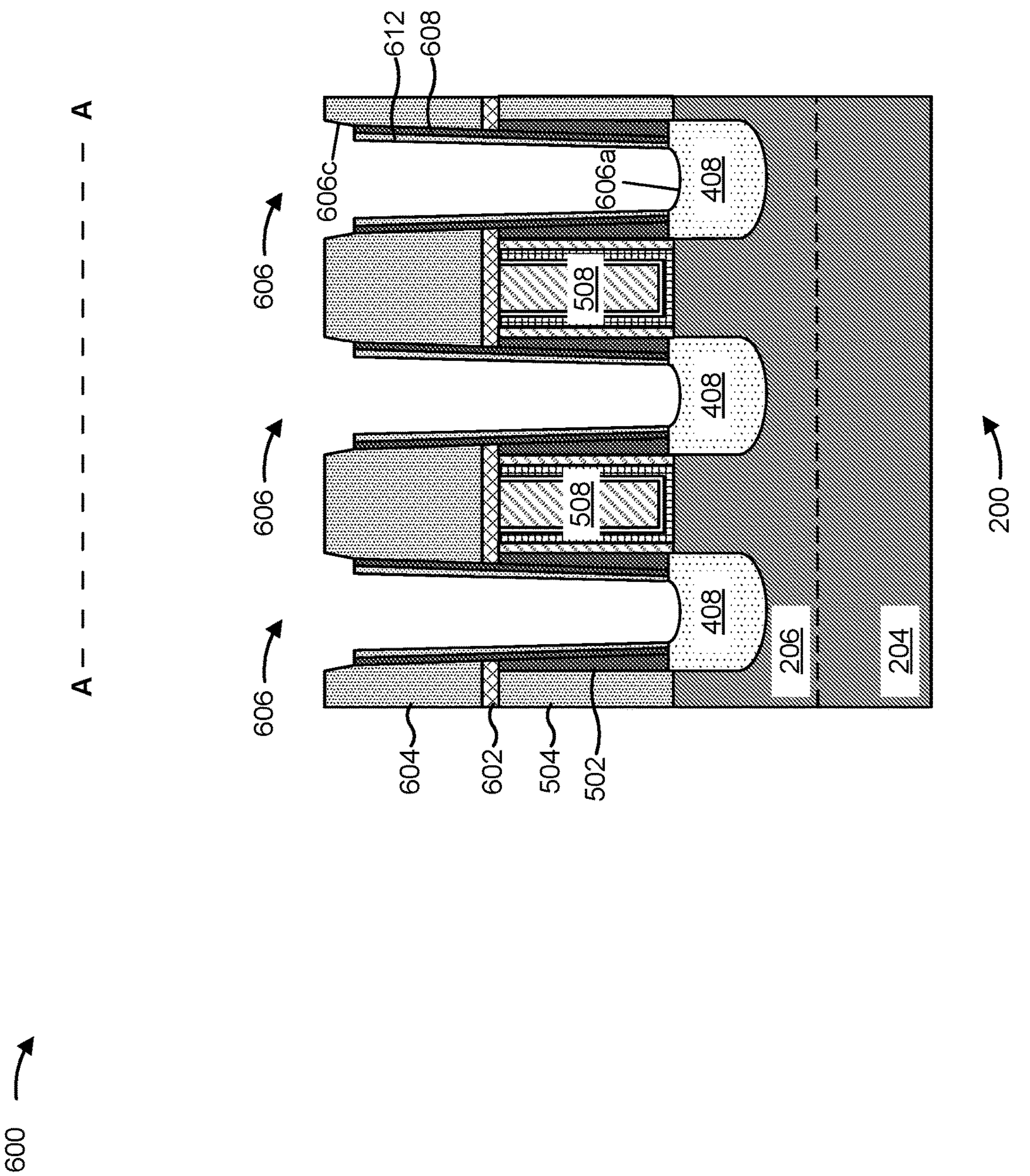

As shown in FIG. 6F, an etch (or punch through) operation may be performed to remove portions of the source/drain contact liner 608 and portions of the source/drain contact liner 612 from the bottom surface 606*a* of the recesses 606 (e.g., corresponding to the top surfaces of the source/drain regions 408). In some implementations, portions of the source/drain contact liner 608 and portions of the source/drain contact liner 612 may also be removed from the sidewalls 606*c* of the recesses 606 during the etch operation. Removing the portions of the source/drain contact liner 608 and portions of the source/drain contact liner 612 from the bottom surface 606*a* of the recesses 606 again exposes the top surfaces of the source/drain regions 408 in the recesses 606. The material(s) included in the source/drain contact liner 608 and in the source/drain contact liner 612 include dielectric material(s), and therefore have relatively high resistivity. Accordingly, the portions of the source/drain contact liner 608 and portions of the source/drain contact liner 612 from the bottom surface 606*a* of the recesses 606 to enable a sufficiently low sheet resistance and/or contact resistance to be achieved between the source/drain regions 408 and source/drain contacts that are to be formed on the source/drain regions 408.

In some implementations, the recesses 606 are formed in a portion of the source/drain regions 408 (e.g., by over etching) such that the recesses 606 extend into a portion of the source/drain regions 408. In some implementations, the etch operation includes a plasma etch technique, a wet chemical etch technique, and/or another type of etch technique.

Figure 6G:
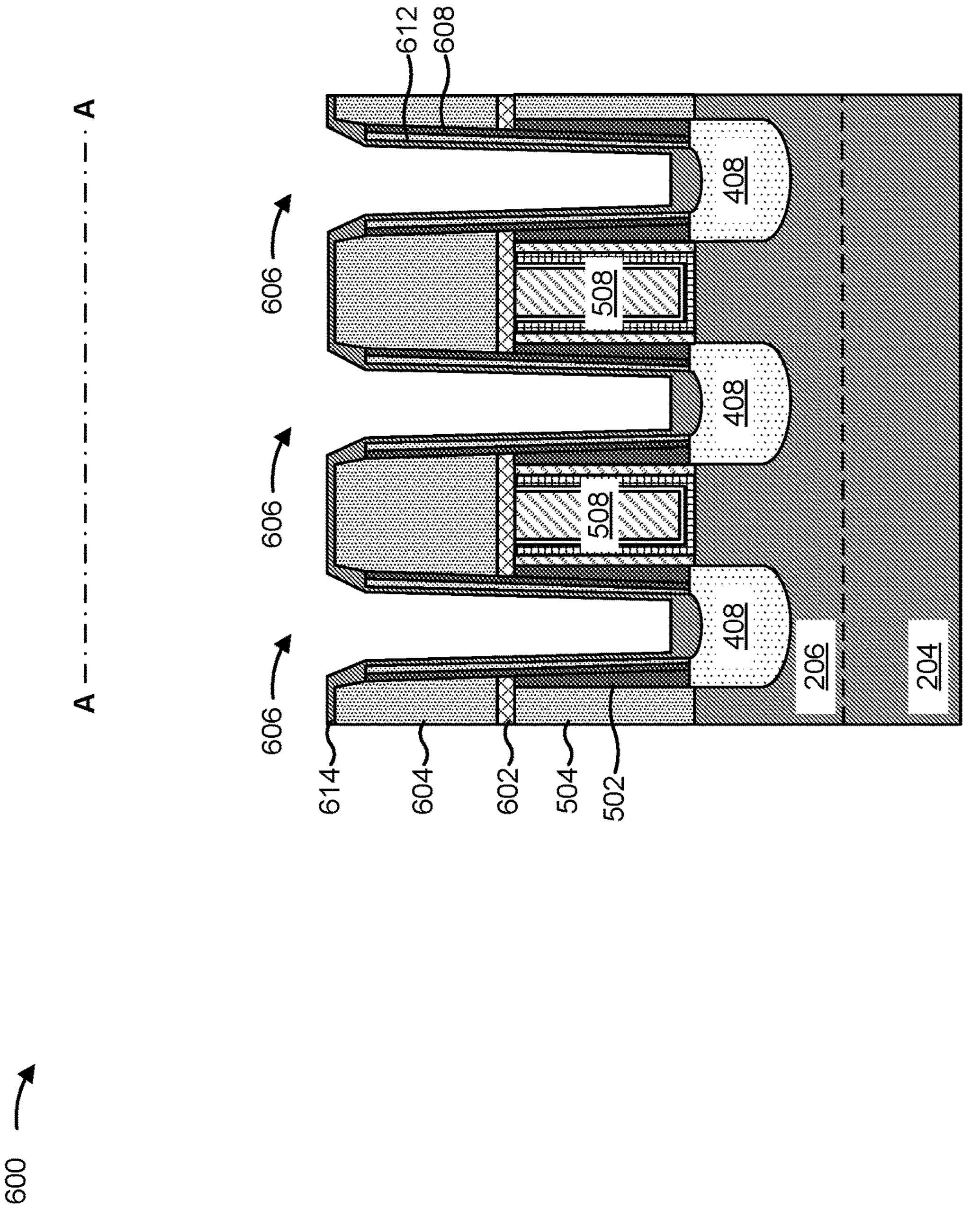

As shown in FIG. 6G, a metal silicide layer 614 may be formed in the recesses 606 on the source/drain contact liner 612 and on the top surfaces of the source/drain regions 408. The metal silicide layer 614 may include a titanium silicide (TiSix), cobalt silicide (CoSix) or another metal silicide layer. The deposition tool 102 may deposit a thin layer of metal material on the top surfaces of the source/drain regions 408 and on the source/drain contact liner 612. The deposition tool 102 may deposit the metal material using a CVD technique, a PVD technique, an ALD technique, another deposition technique described above in connection with FIG. 1, and/or a deposition technique other than as described above in connection with FIG. 1. An annealing operation is then performed in which the temperature of the semiconductor device 200 is rapidly increased to cause atoms from the metal layer to diffuse into the top surface of the source/drain regions 408, thereby forming the metal silicide layer 614.

In some implementations, a pre-cleaning operation is performed to clean the surfaces in the recesses 606 prior to formation of the metal silicide layer 614. In particular, the semiconductor device 200 may be positioned in a processing chamber of the deposition tool 102 (e.g., a pre-clean processing chamber), the processing chamber may be pumped down to an at least partial vacuum (e.g., pressurized to a pressure that is included in a range of approximately 5 Torr to approximately 10 Torr, or to another pressure), and the bottom surfaces 602*a* and the sidewalls 602*b* in the recesses 606 are cleaned using a plasma-based and/or a chemical-based pre-clean agent. The pre-cleaning operation is performed to clean (e.g., remove) oxides and other contaminants or byproducts from the top surfaces source/drain regions 408 that may have formed after the formation of the recesses 606. The reduced amount of oxides and other contaminants on the top surfaces of the source/drain regions 408 resulting from the pre-cleaning operation may enable a sufficiently low contact resistance to be achieved between the metal silicide layer 614 and the source/drain regions 408.

The source/drain contact liner 612 on the source/drain contact liner 608 (both of which are on the sidewalls 602*b* and 602*c* of the recesses 606) protects the source/drain contact liner 608 from damage and/or removal from the sidewalls 602*b* and 602*c* during the pre-cleaning operation. As described above in connection with FIG. 6D, the oxidation treatment operation results in an increased oxygen concentration (e.g., an increased oxide concentration) in the material of the source/drain contact liner 608. The increased oxygen concentration would result in increased susceptibility of removal and/or damage for the source/drain contact liner 608 because of the pre-clean agent that is used in the pre-cleaning operation to remove oxides from the semiconductor device 200. Accordingly, the source/drain contact liner 612 functions as a protection layer or sacrificial layer that shields the high-oxide-concentration material of the source/drain contact liner 608 from the pre-clean agent.

Figure 6H:
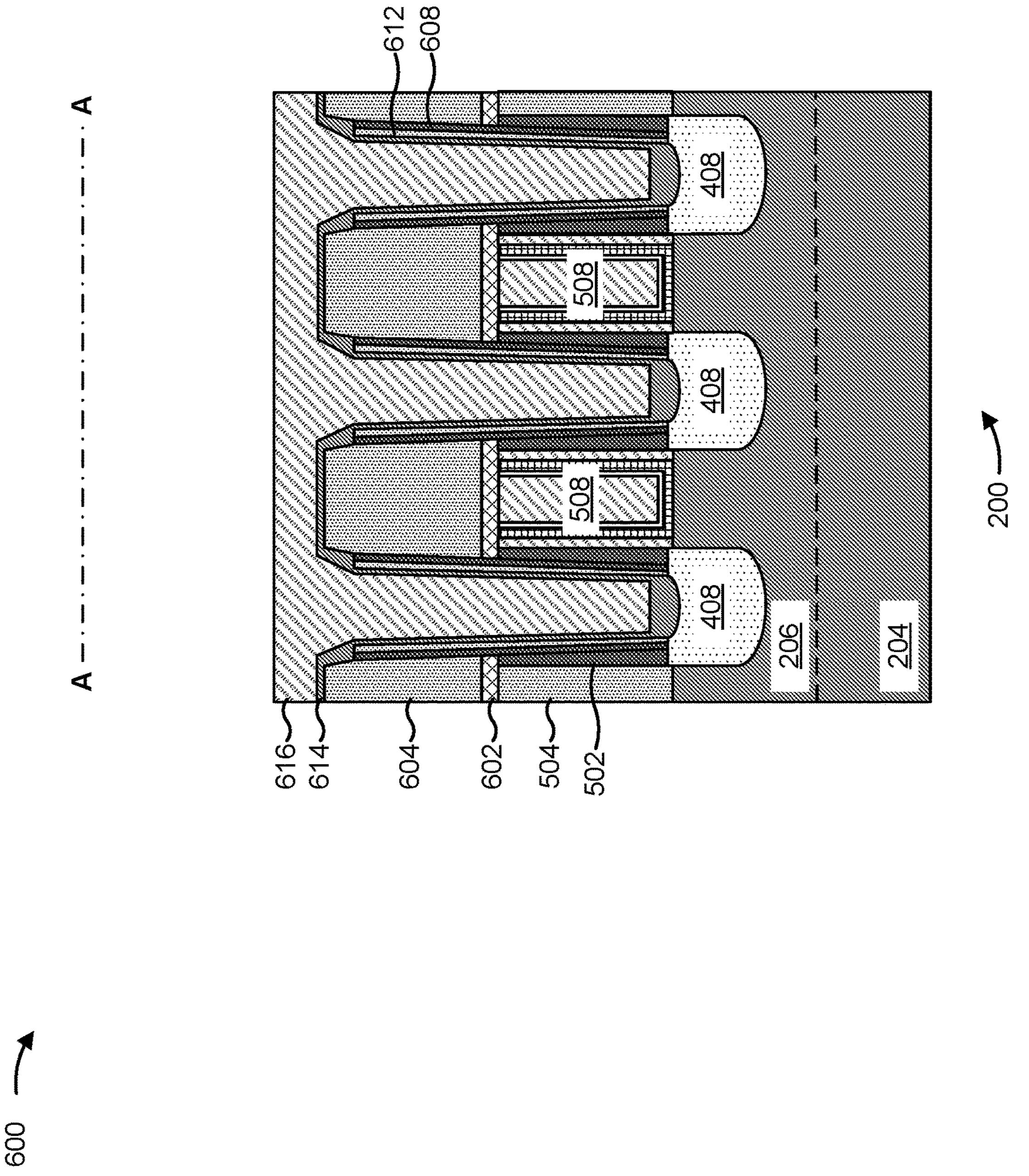
Figure 6I:
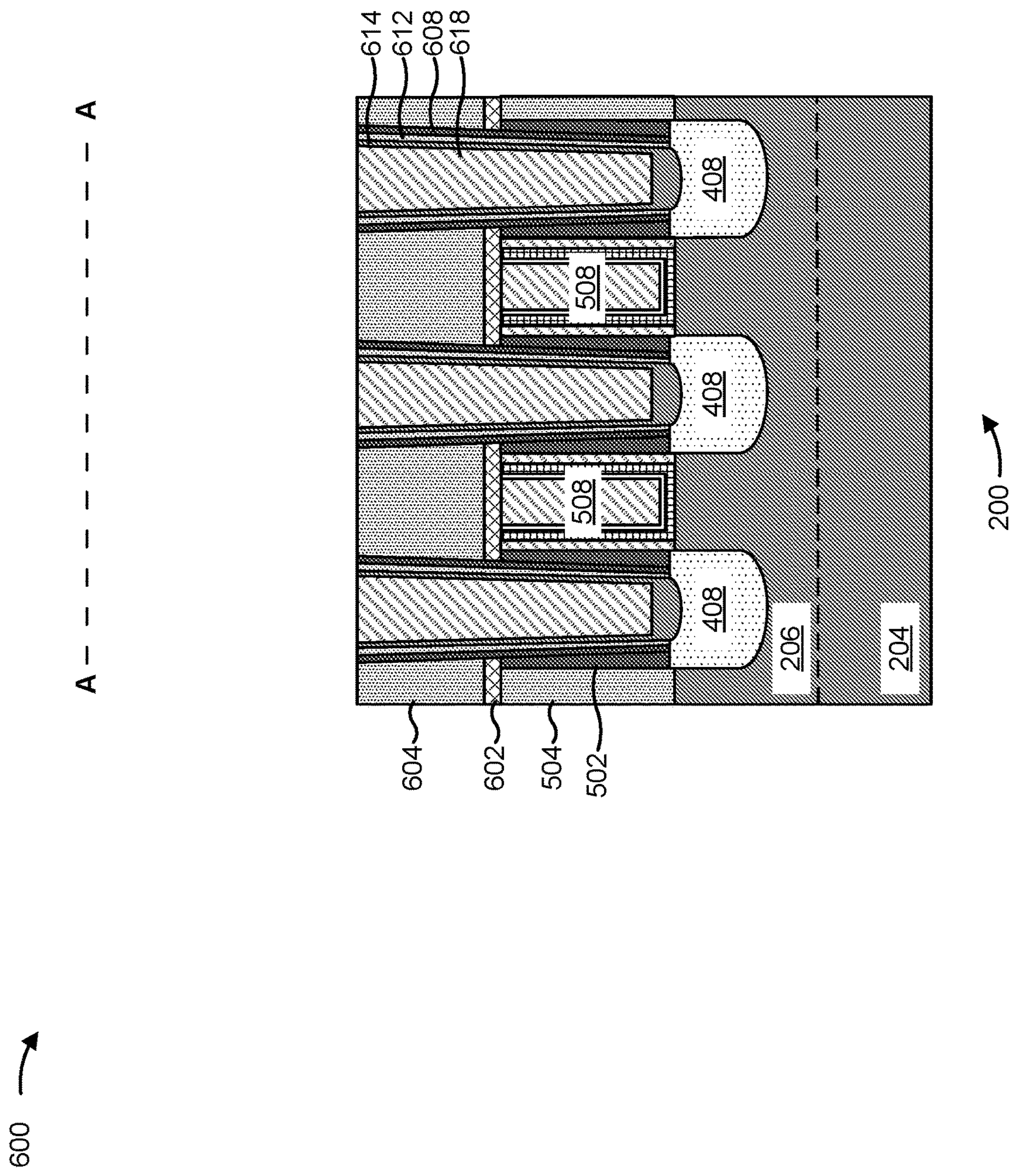

As shown in FIGS. 6H and 6I, source/drain contacts 618 are formed in the semiconductor device 200. In particular, the source/drain contacts 618 are formed in the recesses 606 between the gate structures 508 such that the source/drain contacts 618 and over the source/drain regions 408 and electrically coupled with the source/drain contacts 618.

As shown in FIG. 6H, the deposition tool 102 and/or the plating tool 112 deposits material 616 of the source/drain contacts 618 using a CVD technique, a PVD technique, an ALD technique, an electroplating technique, another deposition technique described above in connection with FIG. 1, and/or a deposition technique other than as described above in connection with FIG. 1. The material 616 of the source/drain contacts 618 may include one or more electrical conductive materials, such as titanium (Ti), cobalt (Co), copper (Cu), ruthenium (Ru), tungsten (W), molybdenum (Mo), an electrically conductive metallic material, an electrically conductive ceramic material, a metal alloy material, another electrically conductive material, or a combination thereof.

As shown in FIG. 6I, the planarization tool 110 may perform a CMP operation or another type of planarization to planarize the material 616 of the source/drain contacts 618. The planarization tool 110 may planarize the source/drain contacts 618 to remove excess material 616 from the source/drain contacts 618 such that top surfaces of the source/drain contacts 618 are approximately co-planar with the top surface of the ILD layer 604.

As further shown in FIG. 6I, the semiconductor device 200 may include a fin structure 206 extending above the substrate 204 of the semiconductor device 200, a gate structure 508 that wraps around at least three sides of the fin structure 206, and a first source/drain region 408 and a second source/drain region 408 on the fin structure 206. The first source/drain region 408 and the second source/drain region 408 may be located on opposing sides of the gate structure 508. The semiconductor device 200 may further include a source/drain contact 618 over the first source/drain region 408 and adjacent to the gate structure 508, a B-CESL 502 between the gate structure 508 and the source/drain contact 618, a gate spacer 404 between the B-CESL 502 and the gate structure 508, and a source/drain contact liner 608 between the B-CESL 502 and the source/drain contact 618. A dielectric constant of the source/drain contact liner 608 may be lesser relative to a dielectric constant of the gate spacer 404, and dielectric constant of the B-CESL 502 may be lesser relative to the dielectric constant of the gate spacer 404. An oxygen concentration of a material of the source/drain contact liner 608 may be greater relative to an oxygen concentration of a material of the gate spacer 404, and an oxygen concentration of a material of the B-CESL 502 may be greater relative to the oxygen concentration of the material of the gate spacer 404.

The semiconductor device 200 may further include a source/drain contact liner 612 between the source/drain contact liner 608 and the source/drain contact 618. A thickness of the source/drain contact liner 608 may be greater relative to a thickness of the source/drain contact liner 612. The dielectric constant of the source/drain contact liner 608 may be lesser relative to a dielectric constant of the source/drain contact liner 612. The oxygen concentration of the material of the source/drain contact liner 608 may be greater relative to an oxygen concentration of a material of the source/drain contact liner 612. The semiconductor device 200 may further include a metal silicide layer 614 between the source/drain contact liner 612 and the source/drain contact 618.

As indicated above, FIGS. 6A-6I are provided as an example. Other examples may differ from what is described with regard to FIGS. 6A-6I.

Figure 7:
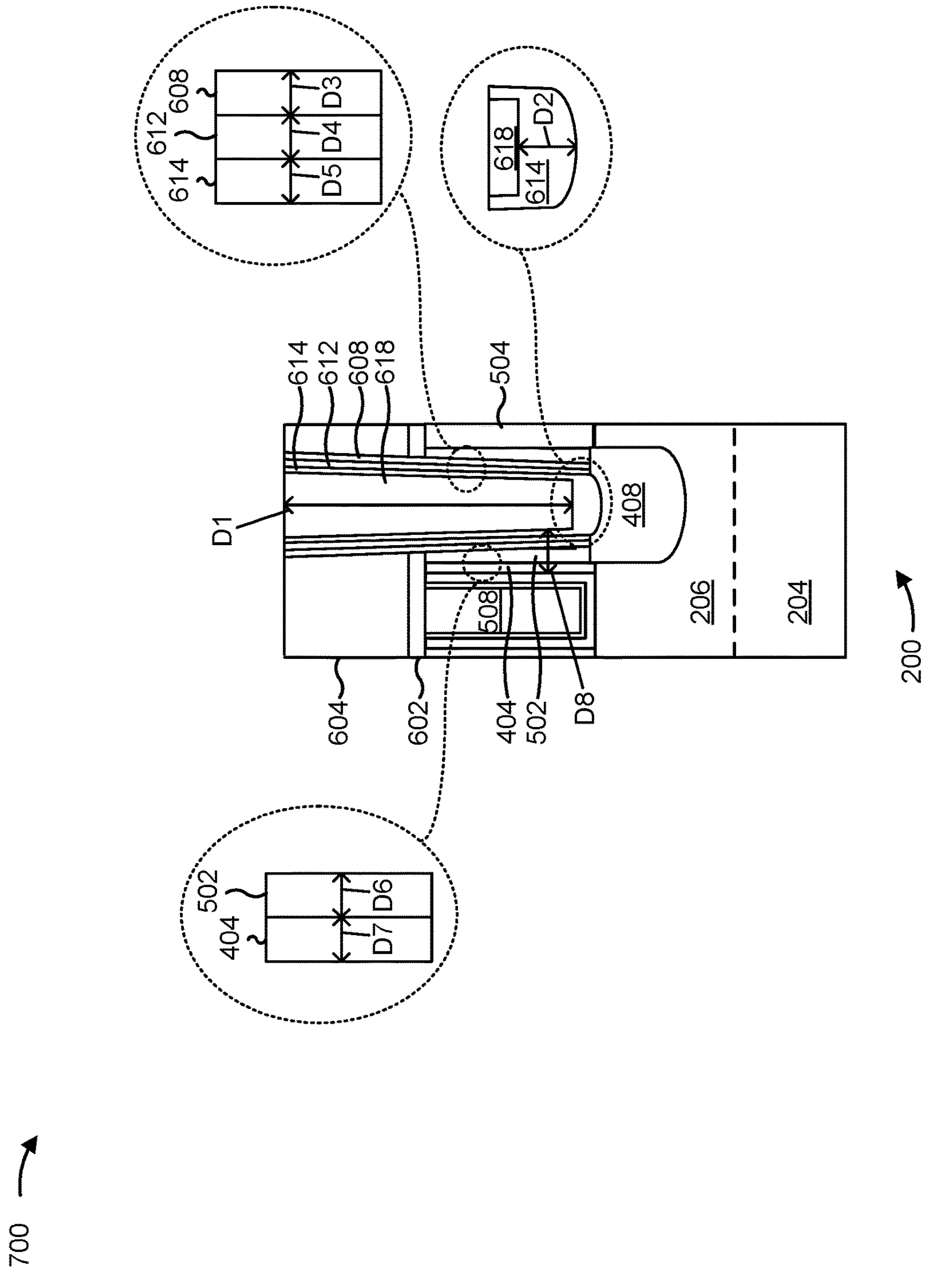
FIG. 7 is a diagram of an example implementation of one or more example dimensions of a semiconductor device described herein.

FIG. 7 is a diagram of an example implementation 700 of one or more example dimensions of a semiconductor device 200 described herein.

As shown in FIG. 7, an example dimension D1 may include a height or thickness of a source/drain contact 618 of the semiconductor device 200. In some implementations, the example dimension D1 may be included in a range of approximately 10 nanometers to approximately 100 nanometers. If the example dimension D1 is less than approximately 10 nanometers, the top surface of the source/drain contact 618 may be at a lower height in the semiconductor device 200 than the gate structure 508, which may result in an inability to planarize the source/drain contact 618. If the example dimension D1 is greater than approximately 100 nanometers, the recess 606 in which the source/drain contact 618 may not be able to be reliability etch, and/or voids and other discontinuities may be formed in the source/drain contact 618. However, other values for the range are within the scope of the present disclosure.

Another example dimension D2 may include a height or thickness of a bottom portion of a metal silicide layer 614 between the source/drain contact 618 and an underlying source/drain region 408 of the semiconductor device 200. In some implementations, the example dimension D2 may be included in a range of approximately 3 nanometers to approximately 10 nanometers. The example dimension D2 being less than approximately 3 nanometers may result in poor electrical contact and, therefore, high contact resistance between the source/drain contact 618 and an underlying source/drain region 408. If the example dimension D2 is greater than approximately 10 nanometers, the remaining amount of unfilled volume in the recess 606 may not be sufficient for the source/drain contact 618, which may result in reduced gap-filling performance in the recess 606. However, other values for the range are within the scope of the present disclosure.

Another example dimension D3 may include a thickness of a source/drain contact liner 608 on sidewalls of the source/drain contact 618. In some implementations, the example dimension D3 may be included in a range of approximately 3 nanometers to approximately 10 nanometers. The example dimension D3 being less than approximately 3 nanometers may result in a high amount of current leakage between the source/drain contact 618 and the gate structure 508. If the example dimension D3 is greater than approximately 10 nanometers, the remaining amount of unfilled volume in the recess 606 may not be sufficient for the source/drain contact 618, which may result in reduced gap-filling performance in the recess 606. However, other values for the range are within the scope of the present disclosure.

Another example dimension D4 may include a thickness of a source/drain contact liner 612 on the sidewalls of the source/drain contact 618. In some implementations, the example dimension D4 may be included in a range of approximately 2 nanometers to approximately 9 nanometers. The example dimension D4 being less than approximately 2 nanometers may result in a high amount of current leakage between the source/drain contact 618 and the gate structure 508. If the example dimension D4 is greater than approximately 9 nanometers, the remaining amount of unfilled volume in the recess 606 may not be sufficient for the source/drain contact 618, which may result in reduced gap-filling performance in the recess 606. However, other values for the range are within the scope of the present disclosure. The example dimension D3 (e.g., the thickness of the source/drain contact liner 608) may be greater relative to the example dimension D4 (e.g., the thickness of the source/drain contact liner 612) due to the source/drain contact liner 612 on the sidewalls 606*b* of the recess 606 being etched during the operation to remove the source/drain contact liner 608 and the source/drain contact liner 612 from the bottom surface 606*a* of the recess 606.

Another example dimension D5 may include a thickness of the metal silicide layer 614 on the sidewalls of the source/drain contact 618. In some implementations, the example dimension D5 may be included in a range of approximately 1 nanometer to approximately 8 nanometers. The example dimension D5 being less than approximately 1 nanometer may result in the formation of discontinuities in the metal silicide layer 614. If the example dimension D5 is greater than approximately 8 nanometers, the remaining amount of unfilled volume in the recess 606 may not be sufficient for the source/drain contact 618, which may result in reduced gap-filling performance in the recess 606. However, other values for the range are within the scope of the present disclosure.

Another example dimension D6 may include a thickness of a B-CESL 502. In some implementations, the example dimension D6 may be included in a range of approximately 3 nanometers to approximately 10 nanometers. The example dimension D6 being less than approximately 3 nanometers may result in a high amount of current leakage between the source/drain contact 618 and the gate structure 508. If the example dimension D6 is greater than approximately 10 nanometers, the remaining amount of unfilled volume in the recess 606 may not be sufficient for the source/drain contact 618, which may result in reduced gap-filling performance in the recess 606. Moreover, the gap-filling performance for the gate structure 508 may also be reduced due to the reduced volume in the recess 506 in which the gate structure 508 is formed. However, other values for the range are within the scope of the present disclosure.

Another example dimension D7 may include a thickness of a gate spacer 404. In some implementations, the example dimension D7 may be included in a range of approximately 3 nanometers to approximately 10 nanometers. The example dimension D7 being less than approximately 3 nanometers may result in a high amount of current leakage between the source/drain contact 618 and the gate structure 508. If the example dimension D7 is greater than approximately 10 nanometers, the remaining amount of unfilled volume in the recess 606 may not be sufficient for the source/drain contact 618, which may result in reduced gap-filling performance in the recess 606. Moreover, the gap-filling performance for the gate structure 508 may also be reduced due to the reduced volume in the recess 506 in which the gate structure 508 is formed. However, other values for the range are within the scope of the present disclosure.

Another example dimension D8 may include a distance or spacing between the gate structure 508 and the adjacent source/drain contact 618. In some implementations, the example dimension D8 may be included in a range of approximately 5 nanometers to approximately 20 nanometers. The example dimension D8 being less than approximately 5 nanometers may result in a high amount of current leakage between the source/drain contact 618 and the gate structure 508. If the example dimension D8 is greater than approximately 20 nanometers, a sufficiently high transistor density in the semiconductor device 200 may not be achievable. However, other values for the range are within the scope of the present disclosure.

As indicated above, FIG. 7 is provided as an example. Other examples may differ from what is described with regard to FIG. 7.

Figure 8:
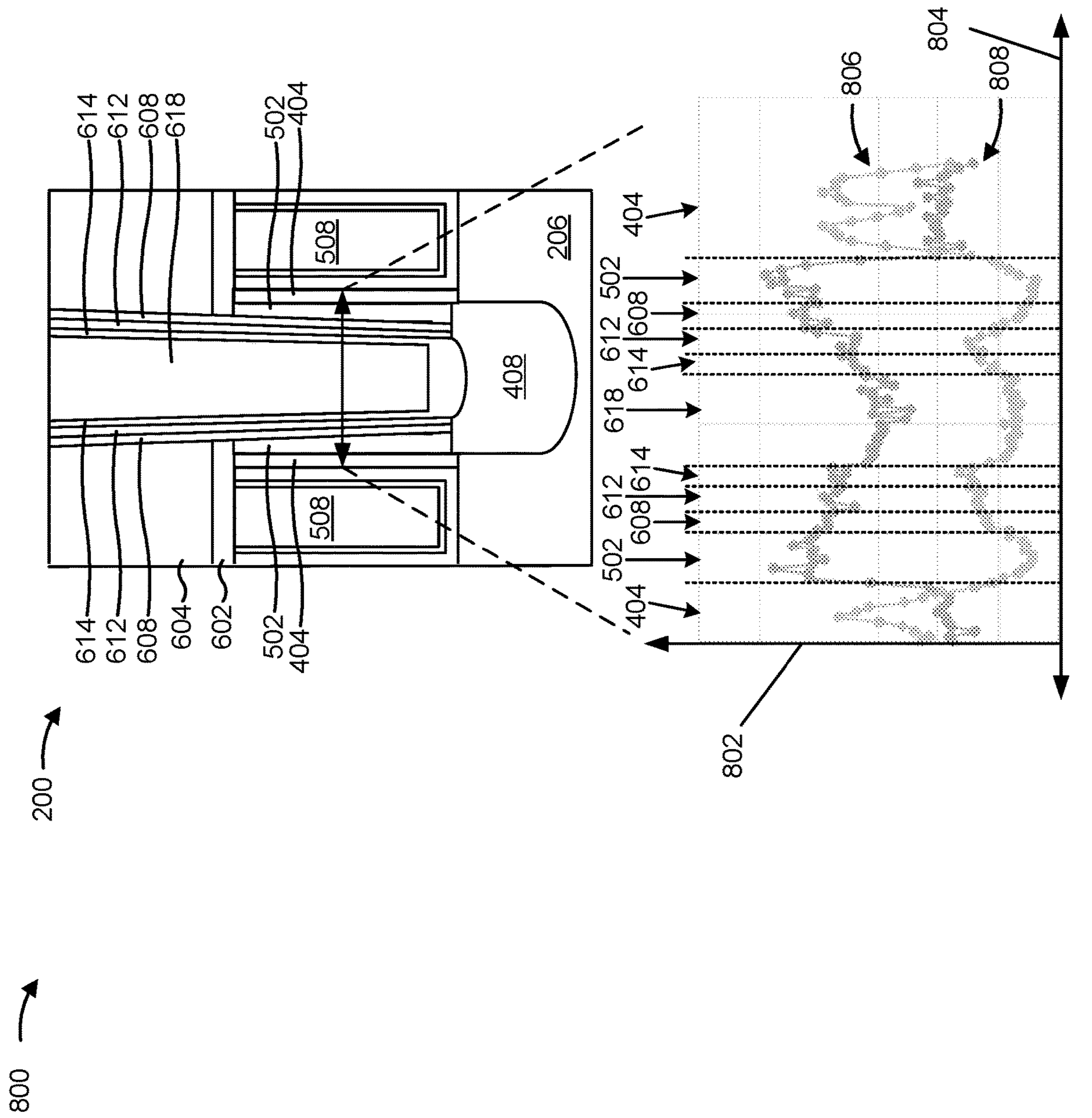
FIG. 8 is a diagram of an example implementation of an elemental composition of a portion of a semiconductor device described herein.

FIG. 8 is a diagram of an example implementation 800 of an elemental composition of a portion of a semiconductor device 200 described herein. FIG. 8 illustrates the elemental composition of the portion of the semiconductor device 200 after the oxidation treatment operation described in connection with FIG. 6D.

As shown in FIG. 8, the portion of the semiconductor device 200 may include a lateral portion across a source/drain contact 618, and may include portions of the gate structure 508, portions of the gate spacers 404 on opposing sides of the gate structure 508, portions of the B-CESL 502 on the gate spacers 404, portions of the source/drain contact liner 608 on the B-CESL 502, portions of the source/drain contact liner 612 on the source/drain contact liner 608, portions of the metal silicide layer 614 on the source/drain contact liner 612, and portions of the source/drain contact 618. The element composition illustrated in FIG. 8 may include an elemental concentration 802, as a function of lateral position 804 in the semiconductor device 200, of nitrogen 806 and oxygen 808. The elemental concentration 802 may include a quantity of atoms (e.g., oxygen atoms) per cubic centimeter or another concentration or density parameter.

As shown in FIG. 8, after the oxidation treatment operation, the elemental concentration 802 of oxygen 808 may be greater relative to the elemental concentration 802 of nitrogen 806 in the B-CESL 502 and the source/drain contact liner 608 as a result of the oxidation treatment operation. As described above, the oxidation treatment operation may be performed to increase the elemental concentration 802 of oxygen 808 in the material of the B-CESL 502 and/or in the material of the source/drain contact liner 608, thereby decreasing the dielectric constant of the in the B-CESL 502 and/or in the source/drain contact liner 608. The reduced dielectric constant of the B-CESL 502 and/or the reduced dielectric constant of the source/drain contact liner 608 may reduce the likelihood of and/or the amount of parasitic capacitance that occurs between the source/drain contact 618 and the gate structure(s) 508 adjacent to the source/drain contact 618. Forming the B-CESL 502 and/or the source/drain contact liner 608 may include depositing a nitride-containing material, and the oxidation treatment operation may result in the elemental concentration 802 of oxygen 808 in the nitride-containing material being greater relative elemental concentration 802 of nitrogen 806 in the nitride-containing material.

As further shown in FIG. 8, the elemental concentration 802 of oxygen 808 in the material of the B-CESL 502 may be greater relative to the elemental concentration 802 of oxygen 808 in the material of the gate spacers 404, and may be greater relative to the elemental concentration 802 of oxygen 808 in the material of the source/drain contact liner 612. Similarly, the elemental concentration 802 of oxygen 808 in the material of the source/drain contact liner 608 may be greater relative to the elemental concentration 802 of oxygen 808 in the material of the gate spacers 404, and may be greater relative to the elemental concentration 802 of oxygen 808 in the material of the source/drain contact liner 612. This occurs due to the high-k material of the source/drain contact liner 612 being deposited after the oxidation treatment operation described in connection with FIG. 6D. Accordingly, the source/drain contact liner 612 may retain the high-k property, which enables the source/drain contact liner 612 to better protect the source/drain contact liner 608 during the pre-cleaning operation described above than if the source/drain contact liner 612 were also treated in the oxidation treatment operation.

As indicated above, FIG. 8 is provided as an example. Other examples may differ from what is described with regard to FIG. 8.

Figure 9:
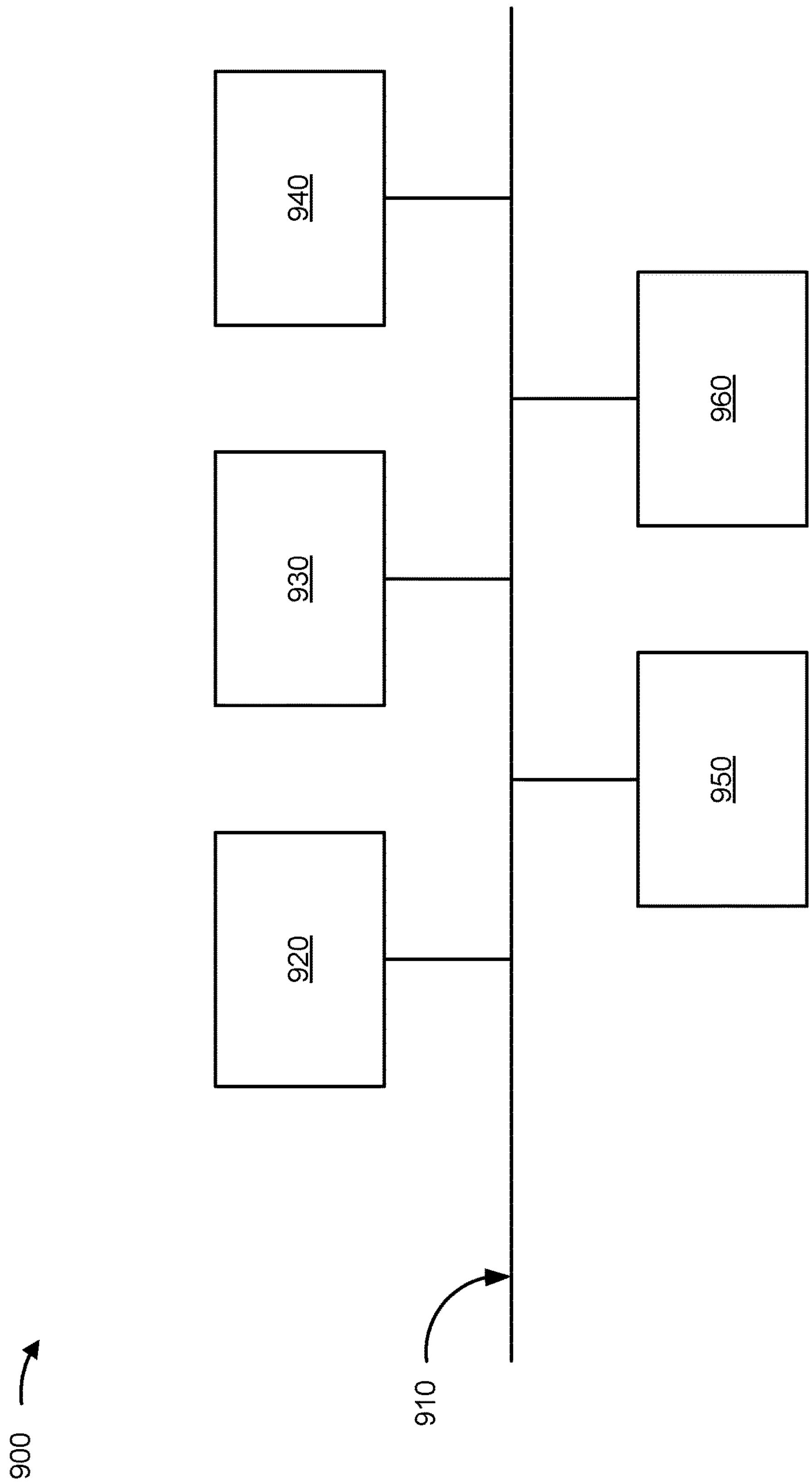
FIG. 9 is a diagram of example components of a device described herein.

FIG. 9 is a diagram of example components of a device 900 described herein. In some implementations, one or more of the semiconductor processing tools 102-112 and/or the wafer/die transport tool 114 may include one or more devices 900 and/or one or more components of the device 900. As shown in FIG. 9, the device 900 may include a bus 910, a processor 920, a memory 930, an input component 940, an output component 950, and/or a communication component 960.

The bus 910 may include one or more components that enable wired and/or wireless communication among the components of the device 900. The bus 910 may couple together two or more components of FIG. 9, such as via operative coupling, communicative coupling, electronic coupling, and/or electric coupling. For example, the bus 910 may include an electrical connection (e.g., a wire, a trace, and/or a lead) and/or a wireless bus. The processor 920 may include a central processing unit, a graphics processing unit, a microprocessor, a controller, a microcontroller, a digital signal processor, a field-programmable gate array, an application-specific integrated circuit, and/or another type of processing component. The processor 920 may be implemented in hardware, firmware, or a combination of hardware and software. In some implementations, the processor 920 may include one or more processors capable of being programmed to perform one or more operations or processes described elsewhere herein.

The memory 930 may include volatile and/or nonvolatile memory. For example, the memory 930 may include random access memory (RAM), read only memory (ROM), a hard disk drive, and/or another type of memory (e.g., a flash memory, a magnetic memory, and/or an optical memory). The memory 930 may include internal memory (e.g., RAM, ROM, or a hard disk drive) and/or removable memory (e.g., removable via a universal serial bus connection). The memory 930 may be a non-transitory computer-readable medium. The memory 930 may store information, one or more instructions, and/or software (e.g., one or more software applications) related to the operation of the device 900. In some implementations, the memory 930 may include one or more memories that are coupled (e.g., communicatively coupled) to one or more processors (e.g., processor 920), such as via the bus 910. Communicative coupling between a processor 920 and a memory 930 may enable the processor 920 to read and/or process information stored in the memory 930 and/or to store information in the memory 930.

The input component 940 may enable the device 900 to receive input, such as user input and/or sensed input. For example, the input component 940 may include a touch screen, a keyboard, a keypad, a mouse, a button, a microphone, a switch, a sensor, a global positioning system sensor, a global navigation satellite system sensor, an accelerometer, a gyroscope, and/or an actuator. The output component 950 may enable the device 900 to provide output, such as via a display, a speaker, and/or a light-emitting diode. The communication component 960 may enable the device 900 to communicate with other devices via a wired connection and/or a wireless connection. For example, the communication component 960 may include a receiver, a transmitter, a transceiver, a modem, a network interface card, and/or an antenna.

The device 900 may perform one or more operations or processes described herein. For example, a non-transitory computer-readable medium (e.g., memory 930) may store a set of instructions (e.g., one or more instructions or code) for execution by the processor 920. The processor 920 may execute the set of instructions to perform one or more operations or processes described herein. In some implementations, execution of the set of instructions, by one or more processors 920, causes the one or more processors 920 and/or the device 900 to perform one or more operations or processes described herein. In some implementations, hardwired circuitry may be used instead of or in combination with the instructions to perform one or more operations or processes described herein. Additionally, or alternatively, the processor 920 may be configured to perform one or more operations or processes described herein. Thus, implementations described herein are not limited to any specific combination of hardware circuitry and software.

The number and arrangement of components shown in FIG. 9 are provided as an example. The device 900 may include additional components, fewer components, different components, or differently arranged components than those shown in FIG. 9. Additionally, or alternatively, a set of components (e.g., one or more components) of the device 900 may perform one or more functions described as being performed by another set of components of the device 900.

Figure 10:
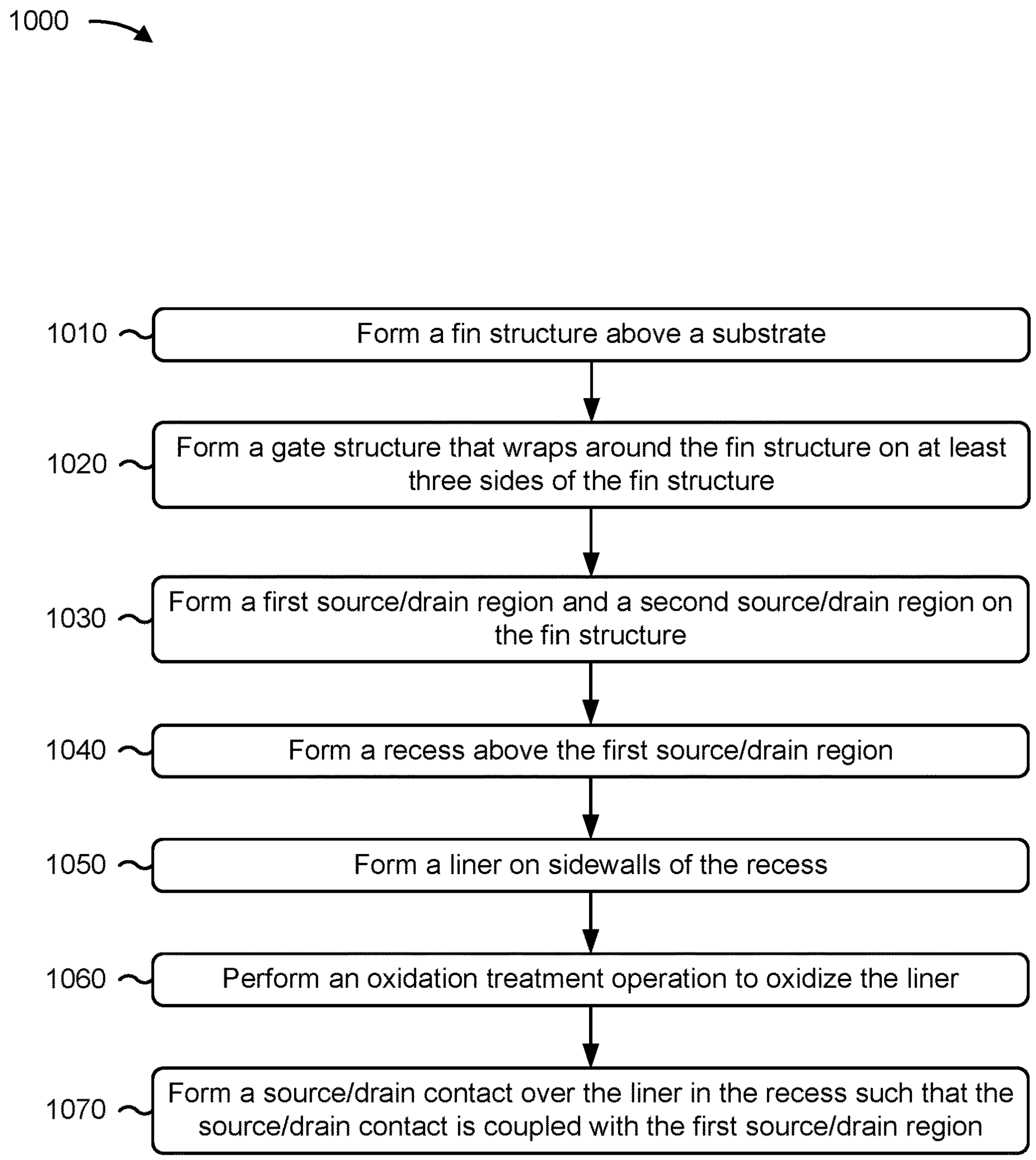
FIG. 10 is a flowchart of an example process associated with forming a semiconductor device described herein.

FIG. 10 is a flowchart of an example process 1000 associated with forming a semiconductor device described herein. In some implementations, one or more process blocks of FIG. 10 are performed by one or more semiconductor processing tools (e.g., one or more of the semiconductor processing tools 102-112). Additionally, or alternatively, one or more process blocks of FIG. 10 may be performed by one or more components of device 900, such as processor 920, memory 930, input component 940, output component 950, and/or communication component 960.

As shown in FIG. 10, process 1000 may include forming a fin structure above a substrate (block 1010). For example, one or more of the semiconductor processing tools 102-112 may form a fin structure 206 above a substrate 204, as described herein.

As further shown in FIG. 10, process 1000 may include forming a gate structure that wraps around the fin structure on at least three sides of the fin structure (block 1020). For example, one or more of the semiconductor processing tools 102-112 may form a gate structure 508 that wraps around the fin structure 206 on at least three sides of the fin structure 206, as described herein.

As further shown in FIG. 10, process 1000 may include forming a first source/drain region and a second source/drain region on the fin structure (block 1030). For example, one or more of the semiconductor processing tools 102-112 may form a first source/drain region 408 and a second source/drain region 408 on the fin structure 206, as described herein. In some implementations, the gate structure 508 is between the first source/drain region 408 and the second source/drain region 408.

As further shown in FIG. 10, process 1000 may include forming a recess above the first source/drain region (block 1040). For example, one or more of the semiconductor processing tools 102-112 may form a recess 606 above the first source/drain region 408, as described herein. In some implementations, the recess 606 is adjacent to the gate structure 508.

As further shown in FIG. 10, process 1000 may include forming a liner on sidewalls of the recess (block 1050). For example, one or more of the semiconductor processing tools 102-112 may form a liner (e.g., a source/drain contact liner 608) on sidewalls 606*b* and/or 606*c* of the recess 606, as described herein.

As further shown in FIG. 10, process 1000 may include performing an oxidation treatment operation to oxidize the liner (block 1060). For example, one or more of the semiconductor processing tools 102-112 may perform an oxidation treatment operation to oxidize the liner (e.g., the source/drain contact liner 608), as described herein.

As further shown in FIG. 10, process 1000 may include forming a source/drain contact over the liner in the recess such that the source/drain contact is coupled with the first source/drain region (block 1070). For example, one or more of the semiconductor processing tools 102-112 may form a source/drain contact 618 over the liner (e.g., the source/drain contact liner 608) in the recess 606 such that the source/drain contact 618 is coupled with the first source/drain region 408, as described herein.

Process 1000 may include additional implementations, such as any single implementation or any combination of implementations described below and/or in connection with one or more other processes described elsewhere herein.

In a first implementation, a dielectric constant of a material of the liner (e.g., the source/drain contact liner 608) is reduced as a result of the oxidation treatment operation.

In a second implementation, alone or in combination with the first implementation, forming the liner (e.g., the source/drain contact liner 608) includes depositing a nitride-containing material to form the liner (e.g., the source/drain contact liner 608), where the oxidation treatment operation results in an oxygen concentration in the nitride-containing material being greater relative to a nitride concentration in the nitride-containing material.

In a third implementation, alone or in combination with one or more of the first and second implementations, performing the oxidation treatment operation comprises performing the oxidation treatment operation to achieve a dielectric constant, for a material of the liner, that satisfies a threshold dielectric constant.

In a fourth implementation, alone or in combination with one or more of the first through third implementations, process 1000 includes forming a bottom contact etch stop layer (B-CESL) (502) after forming the first source/drain region and the second source/drain region, wherein forming the liner comprises forming a portion of the liner on the B-CESL in the recess, and wherein performing the oxidation treatment operation comprises performing the oxidation treatment operation to oxidize the B-CESL.

In a fifth implementation, alone or in combination with one or more of the first through fourth implementations, forming the B-CESL comprises depositing a nitride-containing material to form the B-CESL, wherein the oxidation treatment operation results in an oxygen concentration in the nitride-containing material being greater relative to a nitride concentration in the nitride-containing material.

In a sixth implementation, alone or in combination with one or more of the first through fifth implementations, a dielectric constant of a material of the B-CESL 502 is reduced as a result of the oxidation treatment operation.

Although FIG. 10 shows example blocks of process 1000, in some implementations, process 1000 includes additional blocks, fewer blocks, different blocks, or differently arranged blocks than those depicted in FIG. 10. Additionally, or alternatively, two or more of the blocks of process 1000 may be performed in parallel.

Figure 11:
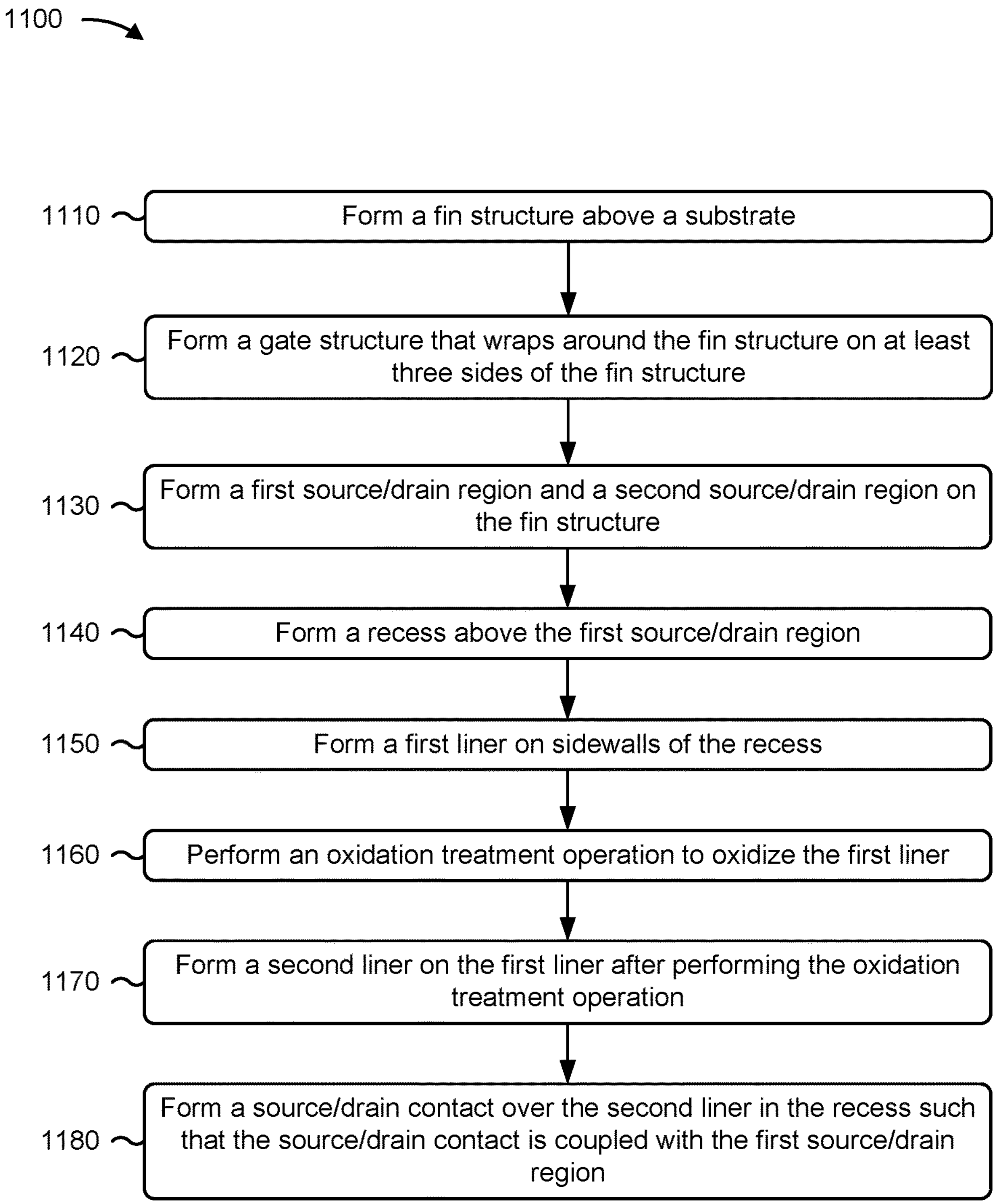
FIG. 11 is a flowchart of an example process associated with forming a semiconductor device described herein.

FIG. 11 is a flowchart of an example process 1100 associated with forming a semiconductor device described herein. In some implementations, one or more process blocks of FIG. 11 are performed by one or more semiconductor processing tools (e.g., one or more of the semiconductor processing tools 102-112). Additionally, or alternatively, one or more process blocks of FIG. 11 may be performed by one or more components of device 900, such as processor 920, memory 930, input component 940, output component 950, and/or communication component 960.

As shown in FIG. 11, process 1100 may include forming a fin structure above a substrate (block 1110). For example, one or more of the semiconductor processing tools 102-112 may form a fin structure 206 above a substrate 204, as described herein.

As further shown in FIG. 11, process 1100 may include forming a gate structure that wraps around the fin structure on at least three sides of the fin structure (block 1120). For example, one or more of the semiconductor processing tools 102-112 may form a gate structure 508 that wraps around the fin structure 206 on at least three sides of the fin structure 206, as described herein.

As further shown in FIG. 11, process 1100 may include forming a first source/drain region and a second source/drain region on the fin structure (block 1130). For example, one or more of the semiconductor processing tools 102-112 may form a first source/drain region 408 and a second source/drain region 408 on the fin structure 206, as described herein. In some implementations, the gate structure 508 is between the first source/drain region 408 and the second source/drain region 408.

As further shown in FIG. 11, process 1100 may include forming a recess above the first source/drain region (block 1140). For example, one or more of the semiconductor processing tools 102-112 may form a recess 606 above the first source/drain region 408, as described herein. In some implementations, the recess 606 is adjacent to the gate structure 508.

As further shown in FIG. 11, process 1100 may include forming a first liner on sidewalls of the recess (block 1150). For example, one or more of the semiconductor processing tools 102-112 may form a first liner (e.g., a source/drain contact liner 608) on sidewalls **606*b* and/or 606*c* of the recess 606**, as described herein.

As further shown in FIG. 11, process 1100 may include performing an oxidation treatment operation to oxidize the first liner (block 1160). For example, one or more of the semiconductor processing tools 102-112 may perform an oxidation treatment operation to oxidize the first liner (e.g., the source/drain contact liner 608), as described herein.

As further shown in FIG. 11, process 1100 may include forming a second liner on the first liner after performing the oxidation treatment operation (block 1170). For example, one or more of the semiconductor processing tools 102-112 may form a second liner (e.g., a source/drain contact liner 612) on the first liner (e.g., the source/drain contact liner 608) after performing the oxidation treatment operation, as described herein.

As further shown in FIG. 11, process 1100 may include forming a source/drain contact over the second liner in the recess such that the source/drain contact is coupled with the first source/drain region (block 1180). For example, one or more of the semiconductor processing tools 102-112 may form a source/drain contact 618 over the second liner (e.g., the source/drain contact liner 612) in the recess 606 such that the source/drain contact 618 is coupled with the first source/drain region 408, as described herein.

Process 1100 may include additional implementations, such as any single implementation or any combination of implementations described below and/or in connection with one or more other processes described elsewhere herein.

In a first implementation, forming the first liner (e.g., the source/drain contact liner 608) includes depositing the first liner on a bottom surface **606*a* of the recess 606, where forming the second liner (e.g., the source/drain contact liner 612) includes depositing the second liner on the first liner, and process 1100 includes removing a portion of the first liner and a portion of the second liner over the bottom surface 606*a* of the recess 606 such that a top surface of the first source/drain region 408 is exposed in the recess 606, where remaining portions of the first liner and remaining portions of the second liner remain over the sidewalls (e.g., sidewalls 606*b*, sidewalls 606*c*) of the recess 606**.

In a second implementation, alone or in combination with the first implementation, process 1100 includes performing a pre-cleaning operation in the recess 606 to remove native oxides from the top surface of the first source/drain region 408, where the second liner (e.g., the source/drain contact liner 612) protects the first liner (e.g., the source/drain contact liner 608) during the pre-cleaning operation, and forming a metal silicide layer 614 on the top surface of the first source/drain region 408, where forming the source/drain contact 618 includes forming the source/drain contact 618 on the metal silicide layer 614.

In a third implementation, alone or in combination with one or more of the first and second implementations, a first dielectric constant of the first liner (e.g., the source/drain contact liner 608), after the oxidation treatment operation, is lesser relative to a second dielectric constant of the second liner (e.g., the source/drain contact liner 612).

In a fourth implementation, alone or in combination with one or more of the first through third implementations, a first oxygen concentration of a first nitrogen-containing material of the first liner (e.g., the source/drain contact liner 608), after the oxidation treatment operation, is greater relative to a second oxygen concentration of a second nitrogen-containing material of the second liner (e.g., the source/drain contact liner 612).

In a fifth implementation, alone or in combination with one or more of the first through fourth implementations, process 1100 includes forming a B-CESL 502 after forming the first source/drain region and the second source/drain region, where forming the first liner (e.g., the source/drain contact liner 608) includes forming a portion of the first liner on the B-CESL 502 in the recess 606, and where performing the oxidation treatment operation includes performing the oxidation treatment operation to oxidize the B-CESL 502.

Although FIG. 11 shows example blocks of process 1100, in some implementations, process 1100 includes additional blocks, fewer blocks, different blocks, or differently arranged blocks than those depicted in FIG. 11. Additionally, or alternatively, two or more of the blocks of process 1100 may be performed in parallel.

In this way, a semiconductor device may include one or more transistor structures that include a plurality of source/drain regions, a semiconductor channel region between the source/drain regions, and a gate structure that is configured to selectively control the conductivity of the semiconductor channel region between the source/drain regions, thereby enabling the transistor structure to be switched between an on state and an off state. The semiconductor device may further include one or more dielectric layers between a source/drain contact structure (e.g., an MD) and a gate structure (e.g., an MG) of the one or more of the transistor structures. The one or more dielectric layers may be manufactured using on oxidation treatment process to tune the dielectric constant of the one or more dielectric layers. The dielectric constant of the one or more dielectric layers may be tuned to reduce the parasitic capacitance between the source/drain contact structure and the gate structure (which are conductive structures). In particular, the dielectric constant of the one or more spacer dielectric may be tuned using the oxidation treatment process to lower the as-deposited dielectric constant of the one or more dielectric layers.

In this way, the oxidation treatment process may be used to lower the dielectric constant of the one or more dielectric layers after the one or more dielectric layers are deposited. This enables the dielectric constant to initially remain high after deposition of the one or more dielectric layers, which enables the one or more dielectric layers to better withstand damage from one or more subsequent semiconductor processing operations (e.g., etching operations, pre-cleaning operations) after deposition of the one or more dielectric layers.

Moreover, this enables the dielectric constant of the one or more dielectric layers to be subsequently reduced, which may reduce the parasitic capacitance between the source/drain contact structure and the gate structure when the transistor structure is operating because the parasitic capacitance between the source/drain contact structure and the gate structure may be directly proportional to the dielectric constant of the one or more dielectric layers between the source/drain contact structure and the gate structure. The reduced parasitic capacitance may enable shorter switching times for the transistor structure, which may increase the performance of the semiconductor device and/or may reduce processing errors in the semiconductor device.

As described in greater detail above, some implementations described herein provide a method. The method includes forming a fin structure above a substrate. The method includes forming a gate structure that wraps around the fin structure on at least three sides of the fin structure. The method includes forming a first source/drain region and a second source/drain region on the fin structure, where the gate structure is between the first source/drain region and the second source/drain region. The method includes forming a recess above the first source/drain region, where the recess is adjacent to the gate structure. The method includes forming a liner on sidewalls of the recess. The method includes performing an oxidation treatment operation to oxidize the liner. The method includes forming a source/drain contact over the liner in the recess such that the source/drain contact is coupled with the first source/drain region.

As described in greater detail above, some implementations described herein provide a semiconductor device. The semiconductor device includes a first source/drain region and a second source/drain region above a substrate. The semiconductor device includes a gate structure, where the first source/drain region and the second source/drain region are located on opposing sides of the gate structure. The semiconductor device includes a source/drain contact over the first source/drain region and adjacent to the gate structure. The semiconductor device includes a B-CESL between the gate structure and the source/drain contact. The semiconductor device includes a gate spacer between the B-CESL and the gate structure. The semiconductor device includes a source/drain contact liner between the B-CESL and the source/drain contact, where a first oxygen concentration of a first material of the source/drain contact liner is greater relative to a second oxygen concentration of a second material of the gate spacer, where a third oxygen concentration of a third material of the B-CESL is greater relative to the second oxygen concentration of the second material of the gate spacer.

As described in greater detail above, some implementations described herein provide a method. The method includes forming a fin structure above a substrate. The method includes forming a gate structure that wraps around the fin structure on at least three sides of the fin structure. The method includes forming a first source/drain region and a second source/drain region on the fin structure, where the gate structure is between the first source/drain region and the second source/drain region. The method includes forming a recess above the first source/drain region, where the recess is adjacent to the gate structure. The method includes forming a first liner on sidewalls of the recess. The method includes performing an oxidation treatment operation to oxidize the first liner. The method includes forming a second liner on the first liner after performing the oxidation treatment operation. The method includes forming a source/drain contact over the second liner in the recess such that the source/drain contact is coupled with the first source/drain region.

As used herein, "satisfying a threshold" may, depending on the context, refer to a value being greater than the threshold, greater than or equal to the threshold, less than the threshold, less than or equal to the threshold, equal to the threshold, not equal to the threshold, or the like.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
forming a fin structure above a substrate;
forming a gate structure that wraps around the fin structure on at least three sides of the fin structure;
forming a first source/drain region and a second source/drain region on the fin structure,
wherein the gate structure is between the first source/drain region and the second source/drain region;
forming a bottom contact etch stop layer (B-CESL) after forming the first source/drain region and the second source/drain region;
forming a recess above the first source/drain region,
wherein the recess is adjacent to the gate structure;
forming a portion of a liner on the B-CESL in the recess;
performing an oxidation treatment operation to oxidize the liner and the B-CESL; and
forming a source/drain contact over the liner in the recess such that the source/drain contact is coupled with the first source/drain region.

2. The method of claim 1, wherein performing the oxidation treatment operation comprises performing the oxidation treatment operation to increase an oxygen concentration of a material of the liner and the B-CESL.

3. The method of claim 1, wherein forming the liner comprises:
depositing a nitride-containing material to form the liner,
wherein the oxidation treatment operation results in an oxygen concentration in the nitride-containing material of the liner being greater relative to a nitride concentration in the nitride-containing material.

4. The method of claim 1, wherein performing the oxidation treatment operation comprises:
performing the oxidation treatment operation to achieve a dielectric constant, for a material of the liner and the B-CESL, that satisfies a threshold dielectric constant.

5. The method of claim 1, wherein forming the B-CESL comprises:
depositing a nitride-containing material to form the B-CESL,
wherein the oxidation treatment operation results in an oxygen concentration in the nitride-containing material-of the B-CESL being greater relative to a nitride concentration in the nitride-containing material.

6. The method of claim 1, wherein a dielectric constant of a material of the B-CESL is reduced as a result of the oxidation treatment operation.

7. A method, comprising:
forming a fin structure above a substrate;
forming a gate structure that wraps around the fin structure on at least three sides of the fin structure;
forming a first source/drain region and a second source/drain region on the fin structure,
wherein the gate structure is between the first source/drain region and the second source/drain region;
forming a recess above the first source/drain region,
wherein the recess is adjacent to the gate structure;
forming a first liner on sidewalls of the recess;
performing an oxidation treatment operation to oxidize the first liner;
forming a second liner on the first liner after performing the oxidation treatment operation; and
forming a source/drain contact over the second liner in the recess such that the source/drain contact is coupled with the first source/drain region,
wherein at least one of:
a first dielectric constant of the first liner, after the oxidation treatment operation, is lesser relative to a second dielectric constant of the second liner, or
a first oxygen concentration of a first nitrogen-containing material of the first liner, after the oxidation treatment operation, is greater relative to a second oxygen concentration of a second nitrogen-containing material of the second liner.

8. The method of claim 7, wherein forming the first liner comprises:
depositing the first liner on a bottom surface of the recess and on the sidewalls of the recess;
wherein forming the second liner comprises:
depositing the second liner on the first liner; and
wherein the method further comprises:
removing a portion of the first liner and a portion of the second liner over the bottom surface of the recess such that a top surface of the first source/drain region is exposed in the recess,
wherein remaining portions of the first liner and remaining portions of the second liner remain over the sidewalls of the recess.

9. The method of claim 8, further comprising:
performing a pre-cleaning operation in the recess to remove native oxides from the top surface of the first source/drain region,
wherein the second liner protects the first liner during the pre-cleaning operation; and
forming a metal silicide layer on the top surface of the first source/drain region,
wherein forming the source/drain contact comprises:
forming the source/drain contact on the metal silicide layer.

10. The method of claim 7, wherein the first dielectric constant of the first liner, after the oxidation treatment operation, is lesser relative to the second dielectric constant of the second liner.

11. The method of claim 7, wherein the first oxygen concentration of the first nitrogen-containing material of the first liner, after the oxidation treatment operation, is greater relative to the second oxygen concentration of the second nitrogen-containing material of the second liner.

12. The method of claim 7, further comprising:
forming a bottom contact etch stop layer (B-CESL) after forming the first source/drain region and the second source/drain region, wherein forming the first liner comprises:
forming a portion of the first liner on the B-CESL in the recess; and
wherein performing the oxidation treatment operation comprises:
performing the oxidation treatment operation to oxidize the B-CESL.

13. The method of claim 7, wherein the first liner and the second liner are on sidewalls of the recess.

14. A method, comprising:
forming a first source/drain region and a second source/drain region above a substrate;
forming a gate structure, the first source/drain region and the second source/drain region being located on opposing sides of the gate structure;
forming a source/drain contact over the first source/drain region and adjacent to the gate structure;
forming a bottom contact etch stop layer (B-CESL) between the gate structure and the source/drain contact;
forming a gate spacer between the B-CESL and the gate structure;
forming a portion of a source/drain contact liner between the B-CESL and the source/drain contact; and
performing an oxidation treatment operation to oxidize the source/drain contact liner and the B-CESL.

15. The method of claim 14, wherein at least one of:
a first oxygen concentration of a first material of the source/drain contact liner is greater relative to a second oxygen concentration of a second material of the gate spacer, or
a third oxygen concentration of a third material of the B-CESL is greater relative to the second oxygen concentration of the second material of the gate spacer.

16. The method of claim 15, wherein the source/drain contact liner comprises a first source/drain contact liner, and wherein the first oxygen concentration of the first material of the first source/drain contact liner is greater relative to a fourth oxygen concentration of a fourth material of a second source/drain contact liner, wherein the second source/drain contact liner is between the first source/drain contact liner and the source/drain contact.

17. The method of claim 14, wherein at least one of:
a first dielectric constant of the source/drain contact liner is lesser relative to a dielectric constant of the gate spacer, or
a second dielectric constant of the B-CESL is lesser relative to the dielectric constant of the gate spacer.

18. The method of claim 14, wherein the source/drain contact liner comprises a first source/drain contact liner, and the method further comprising:
forming a second source/drain contact liner between the first source/drain contact liner and the source/drain contact.

19. The method of claim 18, wherein a first thickness of the first source/drain contact liner is greater relative to a second thickness of the second source/drain contact liner.

20. The method of claim 18, wherein a first dielectric constant of the first source/drain contact liner is lesser relative to a second dielectric constant of the second source/drain contact liner.

* * * * *